United States Patent
Davidson et al.

(10) Patent No.: US 11,233,464 B2
(45) Date of Patent: Jan. 25, 2022

(54) VOLTAGE SOURCE CONVERTER APPARATUS

(71) Applicant: GENERAL ELECTRIC TECHNOLOGY GMBH, Baden (CH)

(72) Inventors: Colin Charnock Davidson, Stafford (GB); Francisco Javier Chivite Zabalza, Stafford (GB); John Lewis Outram, Stafford (GB); Jerome Gregoire, Stafford (GB); Stefan Schroeder, Bavaria (DE)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 17/042,121

(22) PCT Filed: Mar. 7, 2019

(86) PCT No.: PCT/EP2019/055775
§ 371 (c)(1),
(2) Date: Sep. 26, 2020

(87) PCT Pub. No.: WO2019/185327
PCT Pub. Date: Oct. 3, 2019

(65) Prior Publication Data
US 2021/0013816 A1 Jan. 14, 2021

(51) Int. Cl.
*H02M 7/5388* (2007.01)
*H02M 7/483* (2007.01)

(52) U.S. Cl.
CPC ......... *H02M 7/5388* (2013.01); *H02M 7/483* (2013.01); *H02M 7/4835* (2021.05)

(58) Field of Classification Search
CPC .. H02M 7/5387; H02M 7/5388; H02M 7/483; H02M 7/4835
See application file for complete search history.

(56) References Cited

U.S. PATENT DOCUMENTS

2013/0039100 A1 2/2013 Kazama et al.
2013/0221854 A1* 8/2013 Loesenbeck ........... H05B 47/10
315/144

(Continued)

FOREIGN PATENT DOCUMENTS

EP 3089344 A1 11/2016
WO 2017216291 A1 12/2017

OTHER PUBLICATIONS

Schimel: "Design considerations for IGBT modules in inverters and drives", Feb. 8, 2016, XP055511544.

(Continued)

*Primary Examiner* — Adolf D Berhane
(74) *Attorney, Agent, or Firm* — Eversheds Sutherland (US) LLP

(57) ABSTRACT

This application relates to a cell (1200) or sub-module for a voltage source converter (1201). The cell includes an energy storage apparatus (101; 101*a*, 101*b*) and a plurality of dual-switch semiconductor packages (201), each having first and second semiconductor switches (202, 203) connected in series. The cell is operable in an active state in which an energy storage apparatus (101; 101*a*, 101*b*) is electrically connected in series between cell terminals (102*a*, 102*b*) and a bypass state in the cell terminals (102*a*, 102*b*) are electrically connected via a path that bypasses the first energy storage apparatus. The plurality of dual-switch semiconductor switch packages are configured to provide a first set of semiconductor switches (301; 401) connected between nodes of the cell that are electrically connected in the first active state and electrically disconnected in the first bypass state; and a second set of semiconductor switches (302*a*, 302*b*; 402*a*, 402*b*) is connected between nodes of the cell that are electrically disconnected in the first active state and electrically connected in the bypass state. The second set of (Continued)

switches comprises a greater number of switches in parallel than the first set of switches.

15 Claims, 11 Drawing Sheets

(56) References Cited

U.S. PATENT DOCUMENTS

| | | |
|---|---|---|
| 2014/0313797 A1 | 10/2014 | Davidson et al. |
| 2014/0362628 A1 | 12/2014 | Eckel |
| 2015/0222201 A1 | 8/2015 | Nakashima |
| 2021/0135662 A1* | 5/2021 | Davidson .............. H02H 9/041 |
| 2021/0249947 A1* | 8/2021 | Geske ................... H02M 7/219 |

OTHER PUBLICATIONS

Nguyen et al.: "Series connection of IGBT", Applied Power Electronics Conference and Exposition (APEC), 2010 Twenty-Fifth Annual IEEE, Ifff, Piscataway, NJ, USA, Feb. 21, 2010, pp. 2238-2244, XP031649748.

International Search Report of PCT/EP2019/055775 dated May 16, 2019.

European Search Report for Application No. 18164358.6 dated Oct. 10, 2018.

* cited by examiner

VOLTAGE SOURCE CONVERTER APPARATUS

CROSS-REFERENCE TO RELATED APPLICATIONS

This application is a U.S. National Stage Application under 35 U.S.C. 371 and claims the priority benefit of International Application No. PCT/EP2019/055775 filed Mar. 7, 2019, which claims priority to EP18164358.6, filed Mar. 27, 2018, which are both incorporated herein by reference.

BACKGROUND

This application relates to modular apparatus for a voltage source converter and to methods and apparatus for controlling modular apparatus of a voltage source converter, and especially to a modular apparatus that can be used as a cell of a chain-link circuit of a voltage source converter for use in high voltage power transmission.

High-voltage direct current (HVDC) electrical power transmission uses direct current for the transmission of electrical power. This is an alternative to alternating current electrical power transmission which is more common. There are a number of benefits to using HVDC electrical power transmission.

In order to use HVDC electrical power transmission, it is typically necessary to convert alternating current (AC) electrical power to direct current (DC) and back again. Recent developments in the power electronics field have led to an increased use of voltage-source converters (VSCs) for AC to DC and DC to AC conversion. VSCs make use of semiconductor switching elements that can be controllably turned on and off. Insulated gate bipolar transistors (IGBTs) connected with respective anti-parallel diodes have commonly been used as the semiconductor switching elements.

Typically a VSC will comprise a phase limb for each electrical phase of the AC network. Each phase limb may be coupled to the DC network at respective positive and negative DC terminals, e.g. between positive and negative DC busbars, and will also be connected to the AC network via at least one AC node. A phase limb will comprise a plurality of converter arms, with each converter arm extending between an AC node and one of the DC terminals or some other defined DC voltage such as ground. In a symmetric monopole arrangement a phase limb may have two converter arms, a positive converter arm extending between the AC node and the positive DC terminal and a negative converter arm extending between the AC node and the negative DC terminal. In other arrangements, for instance a bipole scheme, there may be more converter arms, for instance there may be two converter arms in series between the positive DC terminal and a ground terminal to form a positive pole, with an AC node at the midpoint of the series connection. Likewise a negative pole is formed by a similar arrangement connected between the ground terminal and the negative DC terminal.

In each case, each converter arm includes a switching apparatus, referred to as a valve.

Various designs of VSC are known. One such variant is the modular multilevel converter (MMC). The valves of an MMC may be formed, at least partly, from a series connection of a plurality of modular units or cells, each cell having an energy storage element, such as a capacitor, and switching elements, such as IGBTs, arranged such that the energy storage element can be selectively connected in series between terminals of the cell or bypassed. The series connection of such cells is sometimes referred to as a chain-link circuit or chain-link converter or simply a chain circuit and the individual cells or links are often referred to as submodules, with a plurality of cells together forming a module. Such chain-link circuits can be used for voltage waveshaping and can allow conversion between AC and DC with relatively low distortion. Such chain-link circuits may also be used in other VSC variants.

The cells of the chain-link circuit may, depending on the type of VSC, be implemented with the switching elements arranged with the energy storage element in a half-bridge type configuration, so the energy storage element may be connected in series between the cell terminals in one orientation or may be bypassed. However, for some VSC designs at least some of the cells of the chain-link circuit may be implemented with the switching elements arranged with the energy storage element in a full-bridge type configuration, so the energy storage element may be bypassed or may be connected in series between the cell terminals in either of two reverse orientations so as to present voltages of opposite polarity at the cell terminals.

BRIEF SUMMARY

FIG. 1a illustrates one example of a cell 100a arranged in a half-bridge configuration. The cell 100a comprises an energy storage element, which in this example is a capacitor 101. A first cell terminal 102a is coupled to the midpoint of a series connection of two switching elements 103, which are connected in series across the capacitor 101. Each switching element 103 comprises a suitable transistor switch device, T1 or T2, such as an IGBT with a respective antiparallel diode, D1 or D2. In a half-bridge cell a second cell terminal 102b is connected on the other side of one of the switching elements 103. The two switching elements 103 thus provide two different switching arms of the half-bridge cell and by switching the switches T1 or T2 in opposition to one another two possible output states can be realised.

With transistor switch T1 closed (turned-on) and transistor switch T2 open (turned off) the capacitor is connected in series between the cell terminals 102a and 102b in what is referred to as an active state. If the capacitor 101 is charged to a given voltage, in this active state, the capacitor voltage will be imposed between the cell terminals. Alternatively to provide a bypass state, transistor switch T2 may be closed to directly connect the cell terminals 102a and 102b, and transistor switch T1 may be opened.

It will be understood that the half-bridge arrangement illustrated in FIG. 1a can only generate a voltage of one polarity across the cell terminals 102a and 102b. As illustrated, the capacitor 101 may be charged such that there is a positive voltage from its lower plate to its upper plate. In the example illustrated in FIG. 1a the second cell terminal 102b is connected to the lower plate of the capacitor 101 and the upper plate of capacitor 101 may be electrically connected, via transistor switch T1, to the first cell terminal 102a, resulting in a positive voltage between the cell terminals (such that the first cell terminal 102a is positive with respect to the second cell terminal 102b). It will be understood however this in some embodiments the second cell terminal could instead be coupled to the upper plate of capacitor 101. Again however such an arrangement can either simply short the cell terminals together so as be at substantially the same voltage or introduce the capacitor in series in one configuration to generate a voltage difference of one polarity between the cell terminals.

In some VSC designs however it may be advantageous for at least some cells to be able to develop voltages of either polarity. FIG. 1b illustrates an example of a cell 100b arranged in a full bridge configuration. In this configuration the capacitor 101 is arranged together with four semiconductor switching elements 103. Like the half-bridge arrangement illustrated in FIG. 1a, a circuit branch comprising first and second transistor switches T1 and T2 in series may be connected across the capacitor 101, with a first cell terminal 102a being coupled to a node between the transistors T1 and T2. In this example however the capacitor 101 is also connected in parallel with another branch having two series connected transistor switches T3 and T4 and the second cell terminal 102b is coupled to the node between T3 and T4. In this example the capacitor 101 can be connected to provide a positive voltage at cell terminal 102a with respect to cell terminal 102b by closing transistor switches T4 and T1, with transistor switches T2 and T3 open to provide a first active state. Alternative however the capacitor voltage can be connected to provide a voltage of opposite polarity across the cell terminals by closing transistor switches T2 and T3, with transistor switches T1 and T4 open to provide a second active state. To provide a bypass path transistor switches T2 and T4 may be closed, with transistor switches T1 and T3 open, or equivalently transistor switches T2 and T4 may be both open, with transistor switches T1 and T3 both closed. Thus a full bridge configuration such as shown in FIG. 1b provide two different active states, of opposite polarity and also allows for two different bypass states.

The full-bridge cell 100b thus provides the ability to selectively provide positive or negative voltages across the cell terminals 102a and 102b, which can be advantageous in some applications. However it will be appreciated that compared to the half-bridge cell 100a illustrated in FIG. 1a, the full-bridge cell 100b requires additional semiconductor switching elements 103, which can add to the cost, size and power losses of the cell, and hence the overall VSC.

As noted above the cells of a chain-link converter for a VSC, such as an MMC type VSC, have commonly been implemented by using IGBTs as the switching elements. Conventional IGBT switching elements have typically been produced in switch packages, e.g. each switch package being a single switch. Thus each switching element 103 would conventionally be implemented by such a single switch package.

Embodiments of the disclosure relate to improvements in half-bridge and full-bridge cell designs for VSCs.

Thus, in one aspect there is provided a cell for a voltage source converter, comprising:

first and second cell terminals; a first energy storage apparatus; and a plurality of dual-switch semiconductor packages, each dual-switch semiconductor package comprising first and second semiconductor switches electrically connected in series between a first package terminal and a second package terminal and a third package terminal electrically connected to a node between the first and second semiconductor switches. The plurality of dual-switch semiconductor switch packages are configured so as to be operable in a first active state, in which the first energy storage apparatus is electrically connected in series between the first and second cell terminals, and a bypass state, in the first and second cell terminals are electrically connected via a path that bypasses the first energy storage apparatus. The plurality of dual-switch semiconductor switch packages is configured such that: a first set of semiconductor switches is connected between nodes of the cell that are electrically connected in the first active state and electrically disconnected in the first bypass state; and a second set of semiconductor switches is connected between nodes of the cell that are electrically disconnected in the first active state and electrically connected in the bypass state. The second set of switches comprises a greater number of switches in parallel than the first set of switches.

Embodiments thus relate to a cell or sub-module for a VSC that makes use of dual-switch semiconductor packages. Such dual-switch semiconductor packages offer a number of benefits as will be set out in more detail below. The dual-switch semiconductor packages are arranged so that there are a greater number of parallel current paths available between nodes of the cell that conduct during the bypass state than between nodes of the cell that only conduct during the first active state. A first set of switches is thus arranged between nodes of the cell that are electrically connected in the first active state of the cell and disconnected in a bypass state. The first set may comprise one or more switches and may or may not comprise switches connected in parallel. The switch(es) of the first set may thus be turned-on during the first active state and turned-off in the bypass state.

A second set of switches is connected between nodes of the cell that are electrically disconnected in the first active state and electrically connected in the bypass state. The second set of switches has more switches connected in parallel than the first set. Thus the second set comprises at least some switches connected in parallel, and more switches in parallel than the number of switches, if any, connected in parallel in the first set. The switches of the second set may thus be turned-on during the bypass state and turned-off in the first active state. As will be explained in more detail below a greater current may be expected to flow in the bypass state, and thus providing parallel switches in the second set allows the higher current to be shared by multiple switches. Providing such additional parallel connections only in the second set of switches avoids the use of redundant switches in the cell with the consequential cost and size implications.

In some embodiments the plurality of dual-switch semiconductor switch packages may be configured such that a third set of semiconductor switches is connected between nodes of the cell that are electrically connected in both the first active state and also in the bypass state. In which case each of the second set of switches and third set of switches may comprise a greater number of switches in parallel than the first set of switches. The plurality of dual-switch semiconductor switch packages may also be configured so as to be further operable in a second active switching state in which the first energy storage apparatus is electrically connected in series between the first and second cell terminals in an opposite orientation to the first switching state. In this case the plurality of dual-switch semiconductor switch packages may be configured such that a fourth set of semiconductor switches is connected between nodes of the cell that are electrically disconnected in both the first active state and the first bypass state and electrically connected in the second active state. Each of the second set of switches and third set of switches may comprise a greater number of switches in parallel than either of the first set of switches and the fourth set of switches.

In some implementations at least one dual-switch semiconductor package may be connected between the first cell terminal and one terminal of the energy storage apparatus to provide the first set of switches and at least two dual-switch semiconductor packages may be connected between the first cell terminal and an opposite terminal of the energy storage apparatus to provide the second set of switches. In some instances the intermediate package terminal of the at least one dual-switch semiconductor package providing said first set of switches may be connected to the intermediate package terminals of the at least two dual-switch semiconductor packages providing said second set of switches via a flying capacitor. Alternatively in some instance the first energy storage apparatus may comprise a first capacitor in series with a second capacitor and the intermediate package terminal of the at least one dual-switch semiconductor package providing the first set of switches may be connected to a midpoint node between the first capacitor and second capacitor by a first steering diode and the intermediate package terminals of the at least one dual-switch semiconductor package providing the second set of switches is connected to the midpoint node between the first capacitor and second capacitor by a second steering diode.

In some embodiments the plurality of dual-switch semiconductor packages may comprise a first dual-switch semiconductor package configured such that the first semiconductor switch of the first dual-switch semiconductor package forms at least part of the first set of switches and the second semiconductor switch of the first dual-switch semiconductor package forms part of said second set of switches.

The plurality of dual-switch semiconductor packages may further comprise a second dual-switch semiconductor package configured such that the first semiconductor switch of the second dual-switch semiconductor package forms part of the second set of switches and the second semiconductor switch of the second dual-switch semiconductor package forms part of the first set of switches. A third dual-switch semiconductor package may be connected in parallel with second and first switches respectively of the first and second dual-switch semiconductor packages.

Alternatively a second dual-switch semiconductor package may be connected in parallel with the second switch of the first dual-switch semiconductor package. The second dual-switch semiconductor package may, in some instances, have a lower voltage rating than the first dual-switch semiconductor package.

In some embodiments at least one dual-switch semiconductor package may be connected directly between the first and second cell terminals to provide some of the second set of switches.

In some embodiments the second set of switches may comprise at least one principal switch and at least one additional dual-switch package wherein the at least one additional dual-switch package is more remote from the energy storage apparatus than the at least one principal switch. The cell may comprise a switch controller configured to, during a switch transition that involves turning-off the switches of the second set, to turn the switches of the at least one additional dual-switch package off before the at least one principal switch. In some implementations a switch controller may be configured to, during a switch transition that involves turning-on the switches of the second set, to turn the switches of the at least one additional dual-switch package on after the at least one principal switch. Alternatively the switch controller may be configured to, during a switch transition that involves turning-on the switches of the second set, to turn the switches of the at least one additional dual-switch package on before the at least one principal switch.

Additional features and embodiments will be set out in the description below.

Aspects also relate to a chain link circuit comprising a plurality of series connected cells according to any of the variants discussed herein.

Aspects also relate to a voltage source converter (VSC) comprising at least one cell according to any of the variants discussed herein or a series connection of such cells. The VSC may, for instance, be a Modular Multilevel Converter (MMC) type VSC. Aspects also relate to a power transmission systems comprising at least one such VSC.

BRIEF DESCRIPTION OF THE DRAWINGS

The invention will now be described by way of example only, with reference to the accompanying drawings, of which.

DETAILED DESCRIPTION

As noted above the cells of a chain-link converter for a VSC, such as an MMC type VSC, have commonly been implemented by using IGBTs as the switching elements. Conventional IGBT switching elements have typically been produced in switch packages with an individual package for each individual switching element, i.e. each switch package provides a single switch. Thus, referring back to FIGS. 1a and 1b each switching element 103 would conventionally be implemented by such a single switch package.

Recently however it has been proposed to provide semiconductor switches as part of a three-terminal, dual-switch semiconductor package. These dual-switch semiconductor packages comprise first and second semiconductor switches connected in series between first and second package terminals. An intermediate (third) package terminal couples to a node between the two semiconductor switches. Such dual-switch semiconductor packages can have various advantages in terms of cost and size over the use of individual single switch packages.

Figure 1A:
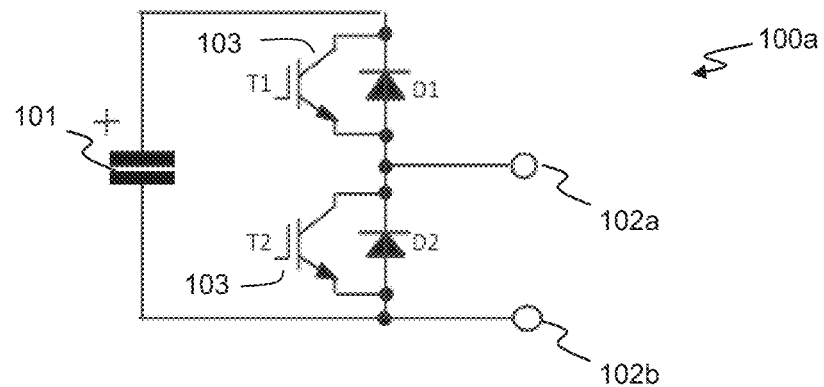
FIGS. 1a and 1b illustrate examples of conventional half-bridge and full-bridge cells respectively, suitable for use in a VSC.

For a half-bridge cell such as illustrated in FIG. 1a, the two switching elements 103, i.e. transistors T1 and T2 with respective diodes D1 and D2, can thus be collectively be provided by one dual-switch semiconductor package, with the intermediate terminal of the dual switch semiconductor package being coupled to, or used as, the first cell terminal 103a. For a full-bridge cell the transistor switches T3 and T4 could also be provided by another dual-switch semiconductor package. Such dual-switch semiconductor packages are typically designed to be easily expandable to higher current ratings by connecting two or more such dual-switch semiconductor packages in parallel. Thus for high current applications it is proposed to use a plurality of dual-switch semiconductor packages in parallel to implement a half-bridge or full-bridge cell as desired.

Figure 1B:
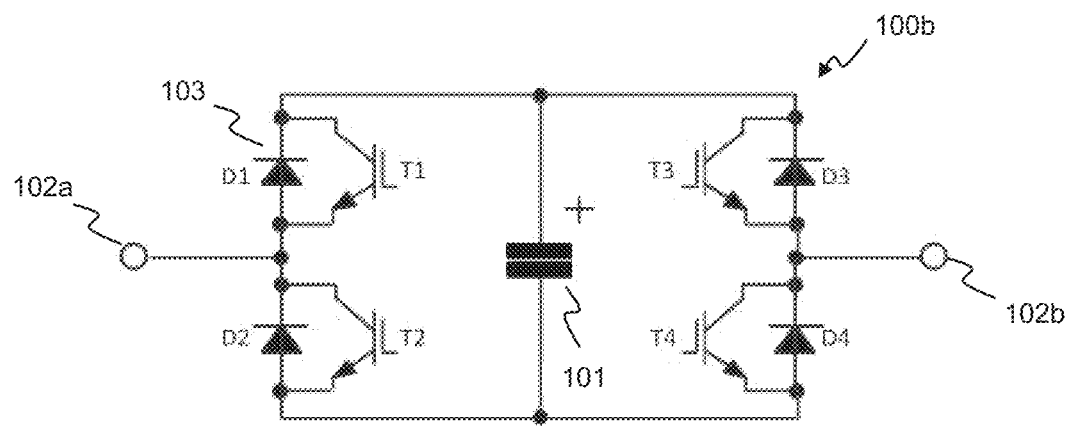
Figure 2A:
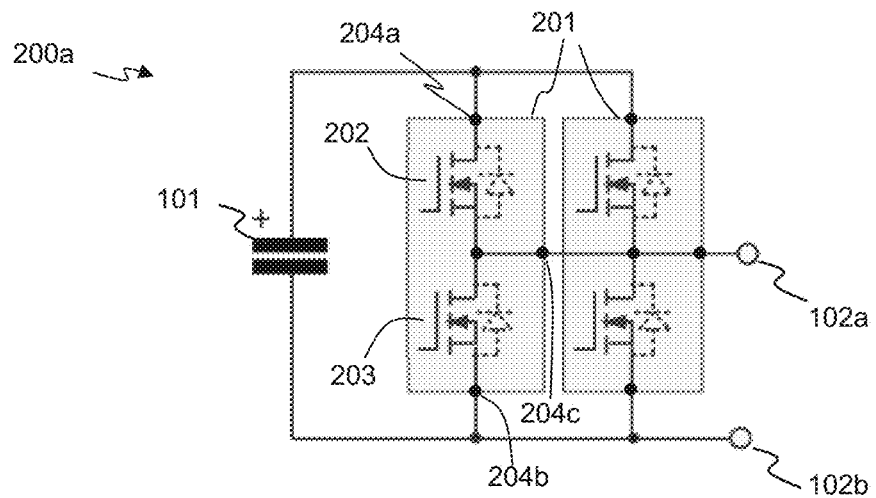
FIGS. 2a and 2b illustrate example half-bridge and full-bridge cells respectively, implemented using dual-switch semiconductor packages.
Figure 2B:
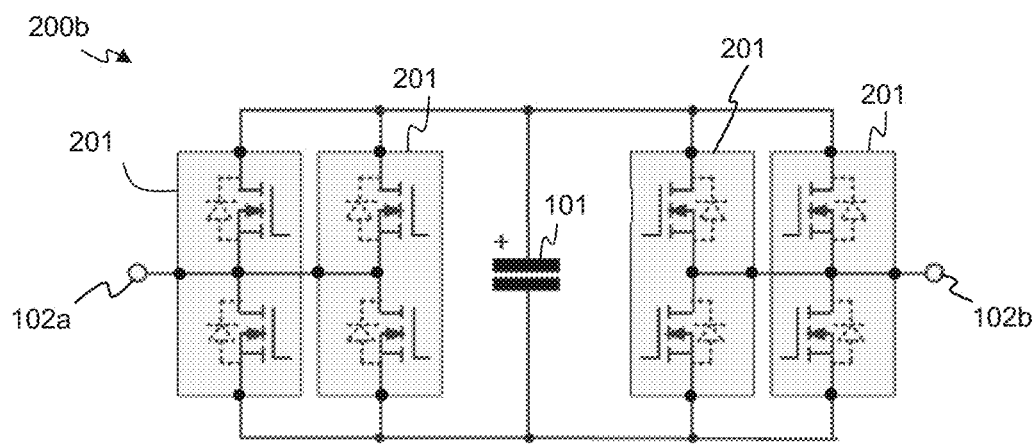

FIGS. 2a and 2b illustrate possible implementations of a half-bridge cell 200a and full-bridge cell 200b respectively, each comprising multiple dual-switch semiconductor packages. The cells 200a and 200b each comprise a capacitor 101 and cell terminals 102a and 102b in a similar fashion as described above with respect to FIGS. 1a and 1b, however in the cells illustrated in FIGS. 2a and 2b the switches are implemented using dual-switch semiconductor packages. FIG. 2a illustrates a half-bridge cell with two dual-switch packages 201.

Each dual-switch semiconductor package 201 has first and second semiconductor switches 202 and 203 with associated diodes. In some instances the switches 202 and 203 may be IGBTs and there may be a separate diode connected as a freewheel diode across the IGBT. However in some implementations the semiconductor switches may be provided by MOSFET devices, which include an inherent body diode and thus there may not be a need for a separate diode component. In any case the semiconductor switches 202 and 203 are arranged in series between first and second package terminals 204a and 204b, with a third package terminal 204c, which will be referred to as an intermediate package terminal, providing a connection to a node between the series connected switches 202 and 203.

In the arrangement illustrated in FIG. 2a, the two dual switch semiconductor packages 201 are connected in parallel across the capacitor 201. Thus the first switch 202 of one dual-switch semiconductor package is connected in parallel with a corresponding first switch of the other dual-switch semiconductor package. Likewise the second switches 203 of the two dual-switch semiconductor packages are connected in parallel. The first switches 202 of the semiconductor packages 201 can thus be operated together to provide the functionality of switch T1 from FIG. 1a and the second switches 203 of the semiconductor packages 201 can be operated together to provide the functionality of switch T2. FIG. 2b illustrates a full bridge cell 200b with two dual-switch semiconductor packages 201 connected in parallel to provide the functionality of switches T1 and T2 of FIG. 1b, with their intermediate package terminals coupled to the cell terminal 102a and a further two dual-switch semiconductor packages 201 connected in parallel to provide the functionality of switches T3 and T4 shown in FIG. 1b.

The arrangements illustrated in FIGS. 1a and 1b can thus provide half-bridge and full-bridge cells that utilise dual-switch semiconductor packages. To provide a required current handling capability, a plurality of the dual-switch semiconductor packages 201 may be connected in parallel. Thus a certain number of dual-switch semiconductor packages may be connected in parallel to provide a current handling capability based on the expected maximum normal operating current.

However for certain types of VSC, such as an MMC type VSC, it is normal for more current to flow between the terminals of the cell of a chain-link circuit of the VSC when the cell is in the bypass state than when in an active state with the energy storage element connected in series between the terminals. This means that the maximum current to be passed via the second switches 203 of the parallel connected dual-switch semiconductor packages 201 (which collectively provide current paths in the bypass state) may be significantly greater than the current which will, in use, be passed via the first switches 202 of the parallel connected dual-switch packages 201 in an active state.

A certain number of dual-switch semiconductor packages 201 can thus be connected in parallel to provide a corresponding number of parallel connected second switches 203 in order to provide the required current handling capability for the bypass state.

However, in the arrangement illustrated in FIG. 2a, this would also result in the same number of parallel connected first switches 202, which may be more than is actually required to handle the expected maximum current flowing in the active state. Such an arrangement would therefore provide more parallel connected switches than would be necessary in a switch position that is only used for providing current paths in an active state. Such switches can thus be seen as unnecessary or redundant switches. Generally for cost and size reasons it would be advantageous to avoid providing unnecessary components in a cell for use in a VSC.

In embodiments of the present disclosure, cells, e.g. submodules, for a VSC may be provided which use dual-switch semiconductor packages but where the dual switch semiconductor packages are arranged such that a first set of one or more semiconductor switches are arranged between nodes of the cell that are electrically connected in an active state and electrically disconnected in a bypass state and a second set of a plurality of semiconductor switches are arranged between nodes of the cell that are electrically disconnected in an active state and electrically connected in a bypass state, where the second set of switches comprises more switches in parallel than the first set of switches.

Figure 3:
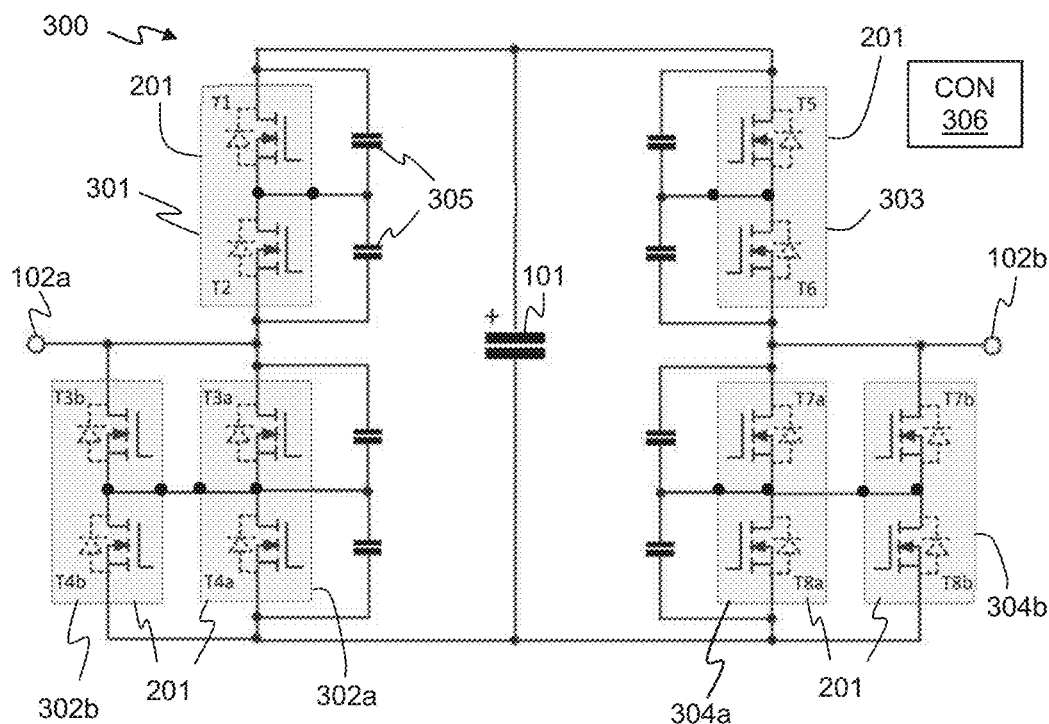
FIG. 3 illustrates one example of a full-bridge cell according to one embodiment.

FIG. 3 illustrates one example of a full-bridge cell (or submodule) 300 for a VSC according to an embodiment. The cell 300 includes a capacitor 101 to act as an energy storage element for the cell and also a plurality of dual-switch semiconductor packages 201 arranged to provide the required switching functionality for the cell. In this example, a first set of semiconductor switches in a first switch position couple the first cell terminal 102a to the upper plate of capacitor 101. In this example the first set of switches comprises a dual-switch semiconductor package 301. A second set of semiconductor switches in a second switch position couple the first cell terminal 102a to the lower plate of capacitor 101. The second set of switches, in this this example, comprises parallel connected dual-switch semiconductor packages 302a and 302b. The second cell terminal 102b is also connected to the upper plate of capacitor 101 by a third set of switches provided by dual-switch semiconductor package 303 in a third switch position, and to the lower plate of capacitor 101 by a fourth set of switches provided by dual-switch semiconductor packages 306a and 306b in parallel in a fourth switch position.

It can therefore be seen that each switch in the second set, e.g. T3a, T3b, T4a, T4b is connected in parallel with (in this example) one other switch. However the first set of switches, T1 and T2, comprise switches which (in this example) have no parallel switch. Likewise each switch in the fourth set, e.g. T7a, T7b, T8a, T8b is connected in parallel with (in this example) one other switch. However the third set of switches, T5 and T6, again comprise switches which (in this example) have no parallel switch. It will of course be appreciated that the second set of switches and/or the fourth set of switches could comprise more than two dual-switch packages 201 in parallel. Also in some embodiments the first and/or third set of switches may include at least one dual-switch package in parallel with packages 301 or 303. However in general there a greater number of switches in parallel in the second and fourth sets than the number of switches (if any) in parallel in either of the first or third sets.

This full bridge cell 300 can be operated to provide the functionality of a conventional full-bridge cell with two main active states (of equal voltage magnitude but opposite polarity) or two possible bypass states. However one of the bypass states provides more switches in parallel than the other bypass state, or either of the two main active states.

The first active state provides a first output voltage, which in this example can be seen as a positive voltage, with the first cell terminal 102a being positive with respect to the second cell terminal 102b, with switches T1, T2, at least one of T7a and T7b and at least one of T8a and T8b all turned-on (closed), and all other switches turned-off (open). In this state the capacitor 101 is connected in series between cell terminals 102b and 102a with its positive plate connected to the first cell terminal 102a. Similarly, in the second active state the cell 300 can provide an output voltage of equal magnitude but opposite polarity (e.g. a negative output voltage) with switches T5, T6, at least one of T3a and T3b and at least one of T4a and T4b all turned-on and all other switches turned-off. This again connects the capacitor 101 in series between terminals 102a and 102b, but in the opposite orientation.

Cell 300 could also be switched into two different possible bypass states. In one bypass state, which can be referred to as a positive bypass state, the switches T1, T2, T5 and T6 are turned-on, with all other switches turned-off. The capacitor 101 is therefore bypassed via a rail of the cell connected to the upper plate of capacitor 101. In an alternative bypass state, which can be referred as a negative bypass state, the switches T3a/T3b, T4a/T4b, T7a/T7b, and T8a/T8b are turned-on with all the switches in the upper position turned-off. In this state capacitor 101 is bypassed via a lower rail of the cell 300 coupled to the lower plate of capacitor 101.

For conventional full-bridge cells used in VSCs, such as that illustrated in FIG. 1b, both the positive and negative bypass states may commonly be used at different times, e.g. on a rotational basis, to share the thermal strain across the semiconductor devices in each switch position.

However, as noted above, during the bypass state in many VSCs there may be a need for the switch(es) providing the bypass path(s) to carry more current than the semiconductor switch(es) used to conduct current in an active state. Therefore, to provide the desired number of parallel switches for the current required in the bypass state, without providing unnecessary or redundant switches for the active state, cell 300 is configured so that a preferred one of the possible bypass states can be implemented by a set of switches which includes the desired number of switches in parallel, whereas a set of switches between nodes of the cell which are not used to carry current in the preferred bypass state, e.g. which would only be turned-on or closed in one of the two active states or the non-preferred bypass sate, have fewer switches in parallel (if any).

In the example shown in FIG. 3 the negative bypass state has been designed as the preferred bypass state. This bypass path is provided by the second set of switches in parallel connected dual-switch semiconductor packages 302a and 302b together with the fourth set of switches in parallel connected dual-switch semiconductor packages 304a and 304b. Each switch used in this preferred bypass path is thus connected in parallel with (in this embodiment) one other switch. It will of course be appreciated that it would be possible to use the positive bypass state as the preferred bypass state.

It will also be appreciated that the fourth set of switches provided by parallel connected dual-switch semiconductor packages 304a and 304b is used during the preferred bypass state but is also used during the first active state. However it will be appreciated however that at least part of the current path established between the cell terminals 102a and 102b in this first active state will include switches T1 and T2. These switches forming part of a current path in the active state have fewer parallel switches (in the example illustrated in FIG. 3 there are no switches in parallel with either T1 or T2) than any switch used for current flow in the preferred bypass state.

It will be noted that in transitioning from an active state to a bypass state or vice versa requires switching both of the series connected switches of a dual-switch semiconductor package 201. For example in the first active state both of the series connected switches T1 and T2 of the dual-switch semiconductor package 301 are turned-on and the series connected switches T3a and T4a (and/or T3b and T4b) of the dual-switch semiconductor packages 302a and 302b are off. In the bypass state both of the series connected switches T1 and T2 of the dual-switch semiconductor package 301 are turned-off and the series connected switches T3a, T4a, T3b and T4b of the dual-switch semiconductor packages 302a and 302b are all turned-on.

To avoid problems with voltage balancing when switching these series connected switches, the series connected switches of each dual-switch semiconductor package 201 is arranged in parallel with a voltage balancing element, in this example a voltage balancing capacitor 305. For example, in the preferred bypass state, the DC voltage of capacitor 101 is applied across the series connected switches T1 and T2 of dual-switch semiconductor package 301. When changing from the bypass state to the active state, the switches T1 and T2 will both be turned-on. However, if one of these switches turned on more rapidly, or there was some timing error so one switch was turned-on before the other, the DC voltage would be disproportionately applied to the other switch. The voltage balancing capacitors 305 thus aid in balancing the voltage across the series connected switches as avoid undue stresses on any of the switches.

It will be understood that in the example of FIG. 3, the fourth set of switches T7a/T7b and T8a/T8b of dual-switch semiconductor packages 304a and 304b may be turned-on or closed to be conducting in both the preferred bypass state and the first (positive) active state. In some VSC arrangements the full-bridge cells of a chain-link circuit may, in normal operation, only be switched between a positive active state and a bypass state, i.e. similar to the operation of a half-bridge cell. The negative active state may only be used during a fault condition for fault blocking. In such a case, the switches T7a/T7b and T8a/T8b may thus be continuously on during normal operation, and likewise switches T5 and T6 of dual-switch semiconductor package 303 may be continually off in normal operation.

It will of course be understood that cell 300 can also operate in a further switching state, which can be termed as a blocked state. In this state all of the switches of the cell 300 are turned off or put in the open state, such that no current can pass through the cell 300. The blocked state is typically used very rarely in use and only used in response to a fault occurring in a part of the VSC.

Operating cell 300 in the above described manner provides various advantages. As noted above if cell 300 is operated, in normal use, to provide just the positive active state or the preferred (negative) bypass state, this means that switches T7a, T7b, T8a and T8b are conducting current in both states. Thus, semiconductor switch packages of higher current rating could be used in these switch positions than for other switch positions. Additionally or alternatively, a larger number of semiconductor switch packages could be connected in parallel at this switch position to increase the current rating at the switch position.

To provide the required operation as switch controller 306 may be arranged as part of the cell. The switch controller may, in use, generate gate control signals for the various semiconductor switches to provide the required operating state and to transition between states according to received control signals from some higher level controller of the VSC.

It should be noted that the various advantages of cell 300 and its operation have been described with the cell being operated to provide a positive output voltage during the active state and using the negative bypass state as the preferred bypass state.

However, the skilled person would understand that the cell 300 could be configured and/or operated to make use of other possible switching configurations to provide similar advantages in other applications.

Cell 300 thus provides the advantage of providing a greater number of semiconductor elements in parallel in a switch position used to conduct current in the (preferred) bypass state than in a switch position which is not used to conduct current in the (preferred) bypass state.

The same principles would apply to a half-bridge variant of the cell, e.g. without dual-switch packages 303, 304a or 304b and with the second cell terminals 102b coupled to either the upper or lower plate of capacitor 101.

Cell 300 does however require that each individual switch, or parallel connection of switches, is connected in parallel with a suitable voltage balancing element, which does add to the number of components required in the cell. In some embodiments a cell topology may be implemented that avoid the need for such parallel voltage balancing elements for each switch.

Figure 4A:
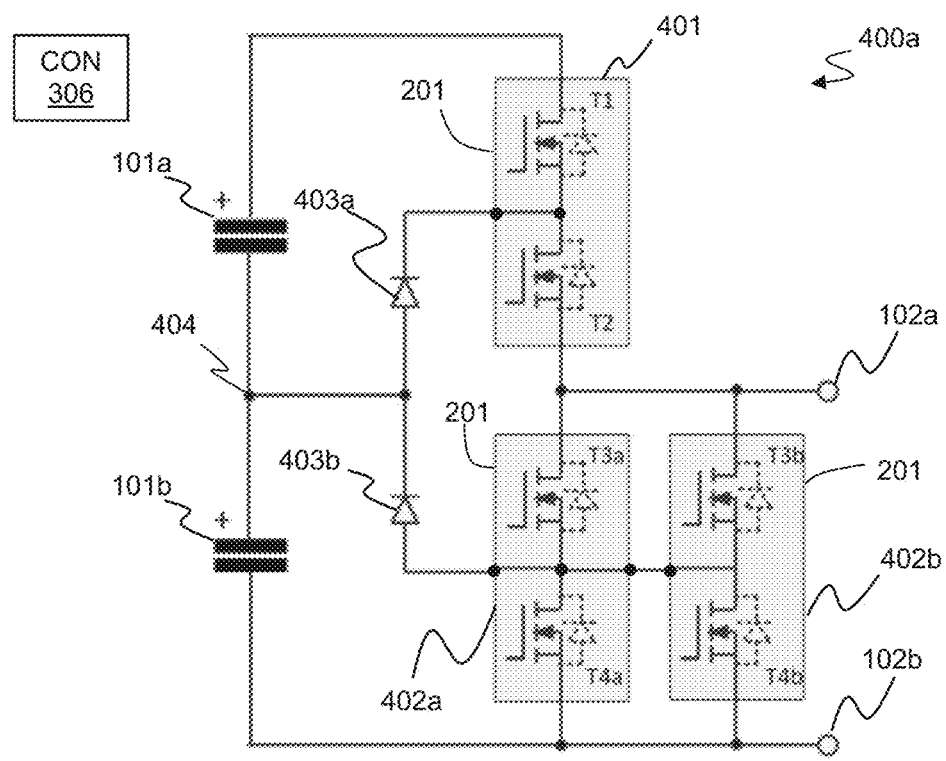
FIGS. 4a and 4b illustrate examples half-bridge and full-bridge cells respectively, according to embodiments of the invention based on a three-level neutral point clamped topology.

FIG. 4a illustrates one example of a half-bridge cell 400a for a VSC according to an embodiment. In this example the half-bridge cell 400a comprises two series connected capacitors 101a and 101b to act as the energy storage elements for the cell. In this half-bridge variant, the lower plate of capacitor 101b is directly coupled to the second cell terminal 102b and the upper plate of capacitor 101a is coupled to the first output terminals by a first set of switches which, in this example comprises a dual-switch semiconductor package 401. The two cell terminals 102a and 102b are also coupled via second set of switches, which in this this example, comprises parallel connected dual-switch semiconductor packages 402a and 402b.

To provide an active state the first set of switches, i.e. T1 and T2 of semiconductor dual-switch semiconductor package 401, may be turned-on (closed), with the switches of the second set being turned-off (open). This will connect capacitors 101a and 101b in series between the cell terminals 102a and 102b. To provide a bypass path the second set of switches, i.e. switches T3a and T4a of dual-switch semiconductor package 402a and parallel switches T3b and T4b of dual-switch semiconductor package 402b, may all be closed, with switches T1 and T2 of package 401 open.

Again therefore it can be seen that each switch in the second set, e.g. T3a, T3b, T4a, T4b is connected in parallel with (in this example) one other switch but the first set of switches, T1 and T2, comprise switches which (in this example) have no parallel switch. It will of course be appreciated that the second set of switches could comprise more dual-switch semiconductor packages 201 in parallel with packages 402a and 402b. Also in some embodiments the first set of switches may include at least one dual-switch semiconductor package in parallel with package 301. However in general there are a greater number of switches in parallel in the second set than the number of switches (if any) in parallel in the first set.

To avoid problems with voltage balancing when switching the series connected switches, a first steering diode 403a is arranged in a path from midpoint node 404 (located between the series connected capacitors 101a and 101b) to the intermediate terminal of dual-switch semiconductor package 401. Likewise the intermediate terminal of the parallel connected dual-switch semiconductor packages 402a and 402b is coupled to the midpoint node 404 via steering diode 303b.

The cell 400a is similar, in some respects, to a design of a neutral-point clamped three-level output half-bridge topology which may be used in other applications, but with a greater number of parallel switches in one switch position. Thus, as well as the main active state, with both capacitors 101a and 101b connected in series between the cell terminals 102a and 102b, and the bypass state, there is a third state, which can be achieved by turning switches T2 and T3a (and/or T3b) on, with the remaining switches off. In this state the capacitor 101b is effectively connected between the cell terminals 102a and 102b, thus providing a lower magnitude output voltage than the first active state.

For use in a chain-link circuit of a VSC a two-level output would generally be sufficient as the required voltage wave-shaping provided by the plurality of cells of the chain-link circuit generally has sufficient resolution. Thus the additional voltage magnitude level enabled by this design need not be maintained for any significant period in use. However it may be beneficial, in some instances, for switch controller 306 to control transition between the first, main, active state (with switches T1 and T2 on and switches T3a/T3b and T4a/T4b off) and the bypass state (with switches T1 and T2 off and switches T3a/T3b and T4a/T4b on) via this intermediate active state (with switches T2 and T3a/T3b on and switches T1 and T4a/T4b off). Including the intermediate state in the transition means that only one switch of each series connection need to be switched at any time. Thus to transition from the main active state to the intermediate active state the switch controller 306 may turn switch T1 off, whilst maintaining switch T2 on, and also turn switches T3a/T3b on whilst maintaining switches T4a/T4b off. Then, to transition from the intermediate active state to the bypass state, switch T2 can be turned off, whilst maintaining switch T1 off, and turning switches T4a/T4b on whilst maintaining switches T3a/T3b on. The transition from the bypass state to the main active state via the intermediate state would involve the reverse process. This can thus provide a smooth transition between the two desired output states, i.e. the main active state and the bypass state, which avoids any significant concerns with regard to switching of series connected switches and voltage balancing. In some embodiments however the intermediate active state need not be used at all and the clamping provided by the steering diodes will provide suitable voltage balancing of the series connected switches.

As mentioned the topology of the cell 400a of FIG. 3a is somewhat similar to some known three-level half-bridge topologies. However as noted given that three different magnitude output levels are not generally required in chain-link circuits such an arrangement would not normally be considered for use in a chain-link circuit of a VSC. Further in the known three-level arrangements it would not be expected that there are more switches in parallel used in one of the output states.

The same principles can be applied to a full-bridge variant of cell for a VSC.

Figure 4B:
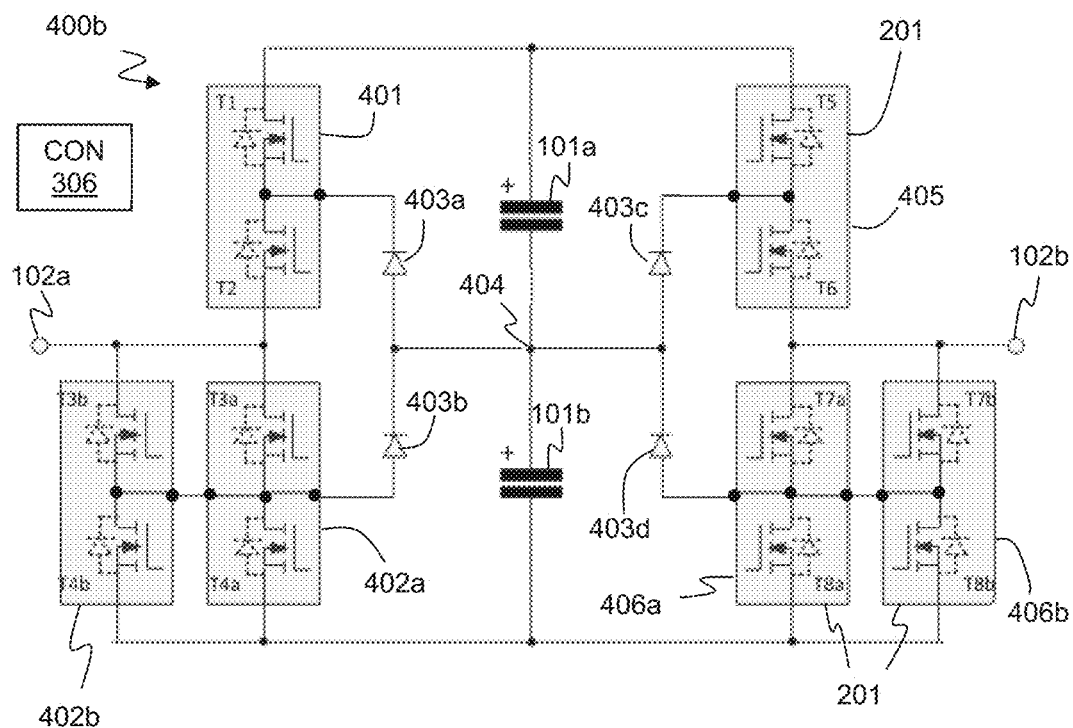

FIG. 4b illustrates an example of a full-bridge cell 400b for a VSC according to an embodiment, in which similar components to those shown in FIG. 4a are identified using the same reference numerals. FIG. 4b illustrates that a first cell terminal may be coupled to a first set of switches, provided by dual-switch semiconductor package 401, and also a second set of switches, provided by dual-switch semiconductor packages 402a and 402b in parallel as discussed above. In the full bridge variant however the second cell terminal 102b is also coupled to two further set of switches, a first further set provided by dual-switch semiconductor package 405 and a second further set provided by dual-switch semiconductor packages 406a and 406b in parallel.

The intermediate nodes of the dual switch semiconductor package 405 and parallel connected packages 406a and 406b are also coupled to the midpoint 404 via further steering diodes 403c and 403d. It will be appreciated that the arrangement of the additional sets of switches, provided by dual-switch semiconductor packages 405, 406a and 406b, and steering diodes with respect to the second cell terminal 102b mirror that discussed above in relation to FIG. 4a.

This full bridge cell 400b can be operated to provide the functionality of a conventional full-bridge cell with two main active states (of equal voltage magnitude but opposite polarity) or two possible bypass states. Again however a preferred one of the bypass states, in this example the negative bypass state, provides more switches in parallel than the other bypass state, or either of the two main active states. The first active state provides a first output voltage, which in this example can be seen as a positive voltage, so that the first cell terminal 102a is positive with respect to the second cell terminal 102b, with switches T1, T2, at least one of T7a and T7b and at least one of T8a and T8b turned-on, and all other switches turned-off. In this state the capacitors 101a and 101b are connected in series between cell terminals 120b and 102a with their positive plates connected to the first cell terminal 102a. Similarly, in the second active state the cell 400b can provide an output voltage of equal magnitude but opposite polarity (e.g. a negative output voltage) across the cell terminals with switches T5, T6, at least one of T3a and T3b and at least one of T4a and T4b all turned on and all other switches turned off. This again connects the capacitors 101a and 101b in series between terminals 102a and 102b, but in the opposite orientation.

Cell 400b could also be switched into two different possible bypass states, but one bypass state (in this example the negative bypass state) is designed as the preferred bypass state with a greater number of parallel switches, in a similar manner as discussed in relation to FIG. 3.

The topology of cell 400b means the cell can also be switched to provide intermediate voltage levels where only one of the capacitors 101a and 101b are connected between the cell terminals 101a and 101b. For example in one intermediate active state switches T2 and T3a/T3b could be closed or turned-on, with switches T1 and T4a/T4b off to effectively connect the first cell terminal 102a to the midpoint node 404 via steering diodes 403a or 403b. If switches T7a/T7b and T8a/T8b are turned-on or closed, with switches T5 and T6 open, this would result in just capacitor 101b being connected between cell terminals 102b and 102a in a positive orientation. This would provide a positive output voltage of a lower magnitude that the main positive active state.

However, as discussed above in relation to FIG. 4a in many VSCs, an intermediate state of different voltage magnitude may generally not be required for the purposes of voltage wave-shaping, as the waveform quality generated by the full chain-link circuit is likely to be of good enough quality when using only the main active states and the preferred bypass state. Thus, as described above an intermediate state may only be used transiently when the switch controller 306 transitions between the active state and the bypass state. For example if generally one positive active state is required in normal operation then switches T7a/T7b and T8a/T8b could be continuously turned-on during normal operation, with switches T5 and T6 off. The cell could then transition from the bypass state to the intermediate positive active state by turning-on switches T4a/T4b and turning-off switch T2 and then transition to the main positive active state by turning-on switches T3a/T3b and turning-off switch T1.

It will be noted however that it would be possible to obtain other intermediate states by selectively controlling switches T7a/T7b and T8a/T8b. For example in another intermediate active state switches T2 and T3a/T3b could be closed or turned-on, with switches T1 and T4a/T4b off to connect cell terminal 102a to the midpoint node 404 and switches T5 and T6 could be closed, with switches T7a/T7b and T8a/T8b open to connect capacitor 101a between cell terminals in a negative orientation. It would also be possible instead to turn-on switches T6 and T7a/T7b to effectively connect second cell terminal 102b to the midpoint node 404 and then close the switches of either package 301 or one or both or packages 402a and 402b to connect either capacitor 101a or 101b between the cell terminals.

As noted above if cell 400b is operated, in normal use, to provide just the main positive active state or the preferred (negative) bypass state (possibly with a positive intermediate state being used briefly during a transition between these two state), this means that switches T7a, T7b, T8a and T8b are conducting current in both states. Thus, semiconductor switch packages of higher current rating could be used in these switch positions than for other switch positions. Additionally or alternatively, a larger number of semiconductor switch packages could be connected in parallel at this switch position to increase the current rating at that switch position.

It should be noted that the various advantages of cell 400b and its operation have been described with the cell being operated to provide a positive output voltage during the main active state and using the negative bypass state as the preferred bypass state. However, the skilled person would understand that the cell 400b could be configured and/or operated to make use of other possible switching configurations to provide similar advantages in other applications.

As discussed above cells 400*a* and 400*b* can be seen as being similar in some respect to three-level neutral-point clamped topologies. Similar benefits can also be achieved using half-bridge and full bridge cells having other topologies.

Figure 5A:
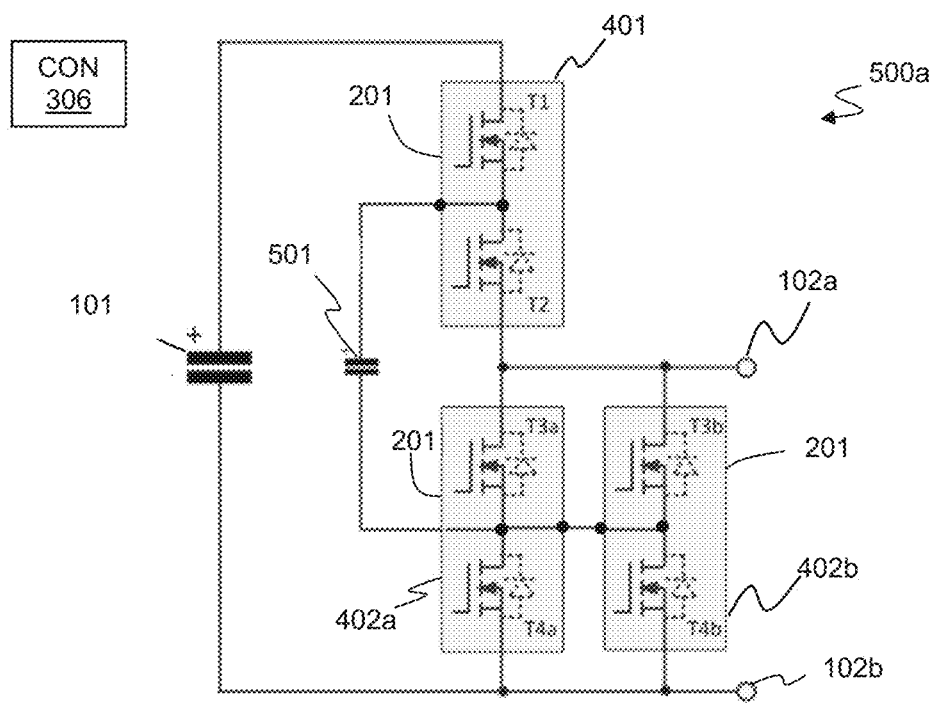
FIGS. 5a and 5b illustrate examples of half-bridge and full-bridge cells respectively, according to embodiments of the invention based on a flying capacitor topology.
Figure 5B:
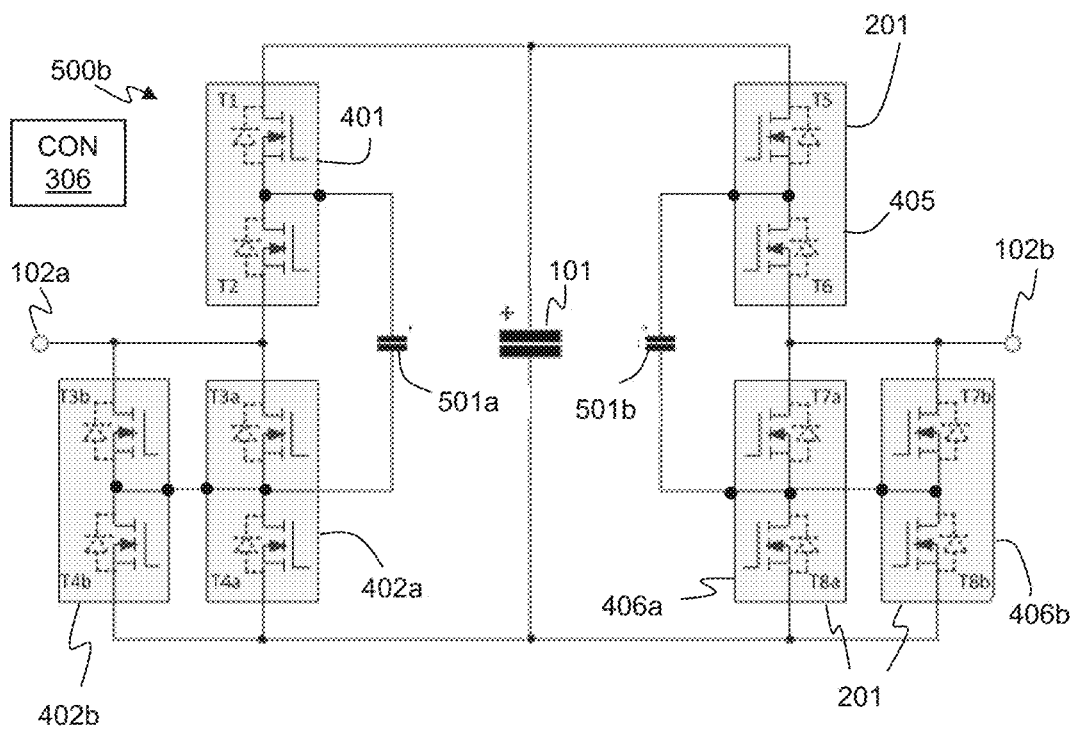

FIG. 5*a* and FIG. 5*b* illustrate further examples of half-bridge and full-bridge cells, respectively, according to embodiments. In FIGS. 5*a* and 5*b* similar components to those shown in the previous figures are identified using the similar reference numerals.

Cell 500*a* shares a similar topology to cell 400*a* with a first set of switches provided by dual-switch semiconductor package 401 for use in the active state and a second set of switches provided by parallel connected dual-switch semiconductor packages 402*a* and 402*b* for use in the bypass state. In cell 500*a* however there is one main DC capacitor 101, and the intermediate terminals of packages 402*a* and 402*b* are coupled to the intermediate terminals of package 401 via a flying capacitor 501.

Cell 500*a* can be operated to provide a main active state and a bypass state in the same way as discussed above in relation to FIG. 4*a*, with the same advantages in terms of providing a greater number of switches in parallel to provide the bypass state than the active state. Cell 500*a* can also operate to provide an intermediate voltage, but in a different way to that described with reference to FIG. 4*a*. To produce an intermediate voltage switches T1 and T3*a*/T3*b* can be turned on with all other switches turned off. This effectively connects the flying capacitor 501 in anti-series with the main DC capacitor 101 between the cell terminals. Alternatively, an intermediate voltage can be produced with switches T2 and T4*a*/T4*b* with all other switches turned off. If the voltage of the flying capacitor is maintained to be half the voltage Voc of the main DC capacitor 101 both these intermediate active states will result in the same intermediate voltage level of $V_{DC}/2$. It will be understood that were the flying capacitor 501 maintained at some other non-zero voltage level (lower than Voc) then the different intermediate states would lead to intermediate voltages of different magnitude. By alternating between these two intermediate active states the voltage on flying capacitor 501 can be balanced. Again the intermediate active state(s) may be used general only as part of transitioning between the main active state and bypass state.

Cell 500*b* shares a similar topology to cell 400*b*, but is based on a flying capacitor design as discussed with reference to FIG. 5*a* and thus cell 500*b* has two flying capacitors 501*a* and 501*b*.

Cell 500*b* may be operated in generally the same way as cells 300 and 400*b* to provide a preferred bypass state and positive and negative active states with the same benefits as described previously. As discussed above, in some implementations the cell may, in normal operation, be controlled by switch controller 306 to alternate between the preferred bypass state and the positive active state in response to some higher level control signal, possibly transitioning between these two states via an intermediate positive active state, with other states being used in abnormal operating conditions. Thus as discussed above the switches T7*a*/T7*b* and T8*a*/T8*b* may be continuously on in normal operation and switches T5 and T6 may be normally off.

Intermediate states may be provided by turning on switches T2 and T4*a*/T4*b* (with T7*a*/T7*b* and T8*a*/T8*b* on) with all other switches turned off or alternatively by turning on T1 and T3*a*/T3*b* (with T7*a*/T7*b* and T8*a*/T8*b* on) with all other switches turned off.

Cells 500*a* and 500*b* provide the advantage of providing a greater number of semiconductor elements in parallel in a switch position used to conduct current in the (preferred) bypass state than in a switch position which is not used to conduct current in the (preferred) bypass state. In some applications the flying capacitor topology of cells 500*a* and 500*b* may be advantageous over the neutral point clamped topology of cells 400*a* and 400*b*. Utilizing a single main DC capacitor 101 in the place of the two DC capacitors 101*a* and 101*b* can provide for a simpler cell architecture in design and manufacture. The use of a flying capacitor 501 in the place of two steering diodes 403*a* and 403*b* may also provide a simpler cell architecture in design and manufacture terms.

Figure 6A:
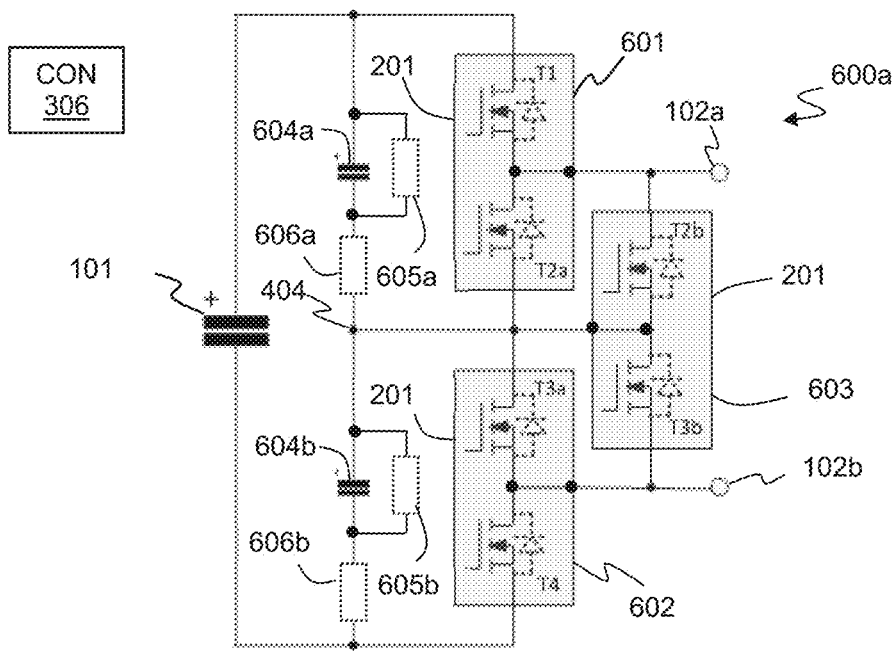
FIGS. 6a and 6b illustrate examples of half-bridge and full-bridge cells respectively, according to further embodiments of the invention.

FIG. 6*a* illustrates a further example of a half-bridge cell 600*a* for a VSC according to an embodiment. In FIG. 6*a* similar components to those shown in previous figures are identified using similar reference numerals.

Cell 600*a* includes a main DC capacitor 101 and a plurality of dual-switch semiconductor packages 201. In this example first and second dual-switch semiconductor packages 601 and 602 are connected in series across the main DC capacitor 101, but in this arrangement the cell terminals 102*a* and 102*b* are coupled to the intermediate terminals of the first and second dual-switch semiconductor packages 601 and 602. In this example the active state is thus enabled by turning on switch T1 of the first semiconductor package 601 and switch T4 of the second semiconductor package 601, with the other switches off. The bypass state is thus provided by turning on switches T2*a* and T3*a* of the semiconductor packages 601 and 602. To provide additional switches in parallel for the bypass state, at least a third dual-switch semiconductor package 603 is coupled between the cell terminals 102*a* and 102*b*. The switches T2*b* and T3*b* of the third dual-switch semiconductor package 503 may be turned on generally in synchronism with the switches T2*a* and T3*b* to provide the bypass state. It can be seen that in this arrangement the first switch T2*b* of dual-switch package 503 is connected in parallel with a switch of semiconductor package 601 and the second switch T3*b* of dual-switch package 603 is connected in parallel with a switch of a different semiconductor package 602.

To provide voltage balancing the intermediate terminal of the third dual-switch semiconductor package 603 is coupled to a node between the first and second semiconductor packages 601 and 602 and further to a node between two auxiliary capacitors 604*a* and 604*b*.

The arrangement of cell 600*a* also provides the ability for intermediate output states, i.e. cell 600*a* can also be seen as a three-level topology, although one skilled in the art will recognise that it can alternatively be seen as a cascaded arrangement of two-level converters. The intermediate voltage can be provided via two different possible intermediate active states. In one intermediate state, auxiliary capacitor 504*a* is connected in series between cell terminals 102*a* and 102*b* with switches T1 and T3*a*/T3*b* turned-on and all other switches turned-off. Alternatively, another intermediate state can be provided to connector auxiliary capacitor 504*b* in series between cell terminals 102*a* and 102*b* with switches T2*a*/T2*b* and T4 turned-on and all other switches turned off. As discussed previously however the intermediate states may not be needed during normal operation and may be used only briefly when transitioning between the main active state and the bypass state, if at all. As the intermediate state would only be used very briefly, the auxiliary capacitors 604*a* and 604*b* would therefore only need to be suitable for use for a relatively short period of time, which would mean that relatively small and/or inexpensive components could be used.

As with cells 400a and 500a, cell 600a provides a half-bridge cell with the advantage of conducting current through more parallel semiconductor elements when the cell is in the bypass state than in the active state.

The topology of cell 600a also provides further advantages. Cell 600a comprises a midpoint connection 404 such that all mechanical components can be conveniently connected in a similar location. This therefore minimises the electrical insulation requirements, which can thus save on cost and waste. Further cost savings measures can also be provided, as the reduced insulation requirements mean that lower-cost dual-switch semiconductor packages could also be used, whilst still providing the high quality wave-shaping function.

In some embodiments voltage balancing between the two auxiliary capacitors 604a and 604b may be achieved passively by using high-value resistors 605a and 605b respectively connected across each capacitor 604a and 604b. Additionally or alternatively in some embodiments damping resistors 606a and 606b may be connected in series with the respective auxiliary capacitors 604a and 604b. These damping resistors 606a and 606b act to damp out parasitic oscillations which can be caused by the very fast switching speeds that may be required in operation of the cell 600a in chain-link circuit of a VSC such an MMC. Such damping resistors may be usefully implemented in some of the other embodiments described herein, where an additional or auxiliary capacitor—in addition to a main DC capacitor, is provided and which carries the main load current only for short durations during switching transitions between states, if at all.

As discussed previously, conventionally silicon IGBTs have been used as the semiconductor switching elements for a cell of a chain-link circuit if a VSC such an MMC. However, developments in the HVDC industry have meant that silicon-carbide MOSFETs are increasingly being proposed as the semiconductor switching elements for use in VSCs. Silicon-carbide MOSFETs provide even greater switching speeds than silicon IGBTs and thus the damping resistors would be advantageously utilized when used with silicon-carbide MOSFETs.

Figure 6B:
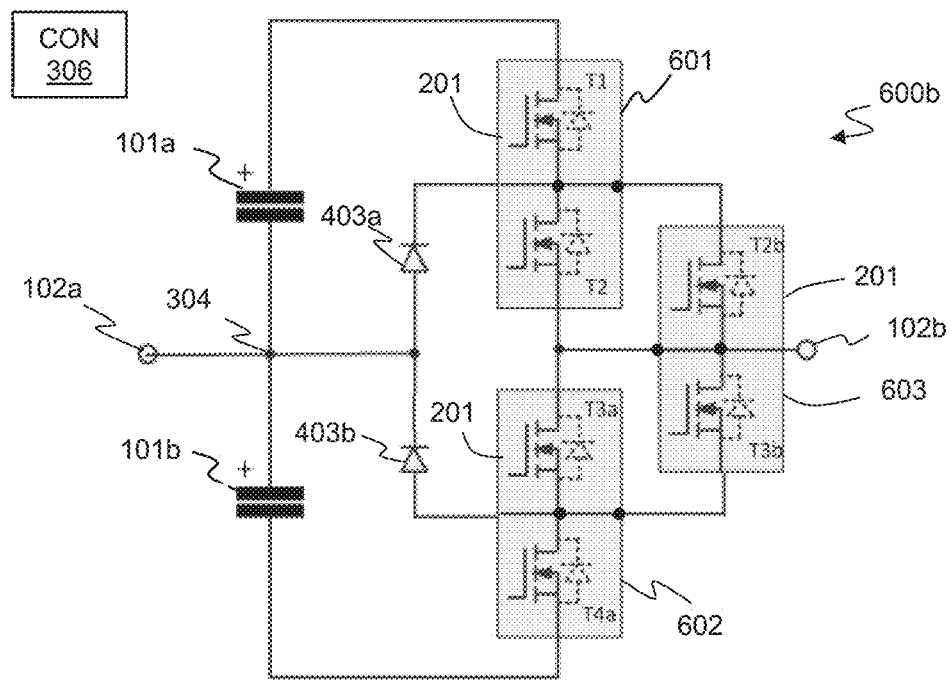

The arrangement of dual-switch semiconductor packages 201, where at least one dual-switch semiconductor package is connected in parallel between the intermediate terminals of two other dual-switch semiconductor packages, can also be used in a topology based on the three-level neutral-point-clamped design discussed with reference to FIG. 4a to provide a variant cell that allows full-bridge type operation. FIG. 6b illustrates a further example of a cell 600b for a VSC according to an embodiment. In cell 600b there are two series connected DC capacitors 101a and 101b in a similar fashion as discussed with reference to FIG. 4a. There are also three dual-switch packages 201. First and second dual-switch semiconductor packages 601 and 602 are connected in series across the two series connected DC capacitors 101a and 101b. A third dual-switch semiconductor package 603 is connected in parallel between the intermediate terminals of the first and second dual-switch semiconductor packages 601 and 602.

In this example however the intermediate terminals of the first and second dual-switch semiconductor packages 601 and 602 are also connected to a midpoint 404 between the two DC capacitors 101a and 101b via respective steering diodes 403a and 403b. A first cell terminal 102a is also connected to this midpoint node 404 with the second cell terminal being connected to the intermediate terminal of dual-switch semiconductor package 603 and the midpoint between dual-switch semiconductor packages 601 and 602.

This cell 600b can provide a positive active state, a negative active state and a bypass state. To provide a positive output voltage, switches T3a/T3b and T4a are turned on, with all other switches turned off. This connects capacitor 101b between the cell terminals 102a and 102b in a positive orientation, i.e. with its positive plate connected to the first cell terminal 102a. To provide a negative active state switches T1 and T2a/T2b are turned, with all the other switches turned off. This connects the capacitor 101a between the cell terminals 102a and 102b in a negative orientation. The bypass state can be provided by turning on switches T2a/T2b and T3a/T3b, with all other switches turned off. It will be clear that each of the active states thus only connects one of the DC capacitors 101a or 101b between the cell terminals and thus the voltage magnitude output in the active state will be that of a single capacitor (rather than both capacitors in series as described with respect to some other variants). It will also be understood that cell 600b does not provide other active states of different voltage magnitude, but, as discussed above, alternating between a bypass (zero voltage state) and an active state of one magnitude is sufficient for use in a chain link circuit of a VSC.

With this switching arrangement it can be seen that there is again a greater number of switching elements connected in parallel available to conduct current in the bypass state than either active state. The cell 600b thus provides the same advantages as discussed above when the cell is utilized in a chain-link circuit of a VSC such an MMC. The topology of cell 600c also provides similar advantages to cell 600a, due to the convenient midpoint connection. This again provides reduced electrical insulation requirements.

Figure 7A:
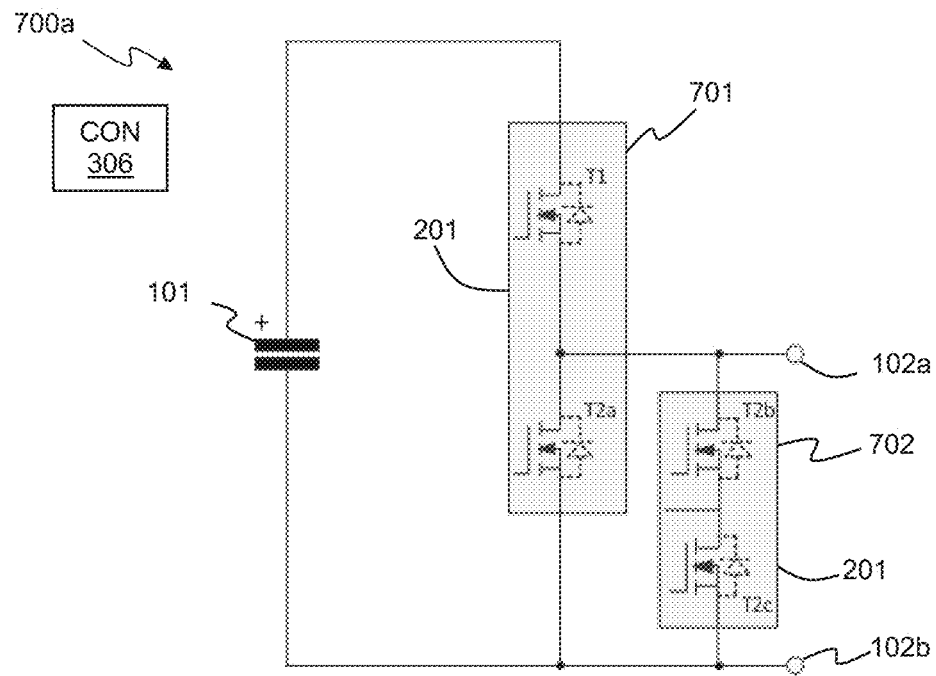
FIGS. 7a and 7b illustrate examples of half-bridge and full-bridge cells respectively, according to embodiments of the invention using semiconductor packages that may have different voltage ratings.
Figure 7B:
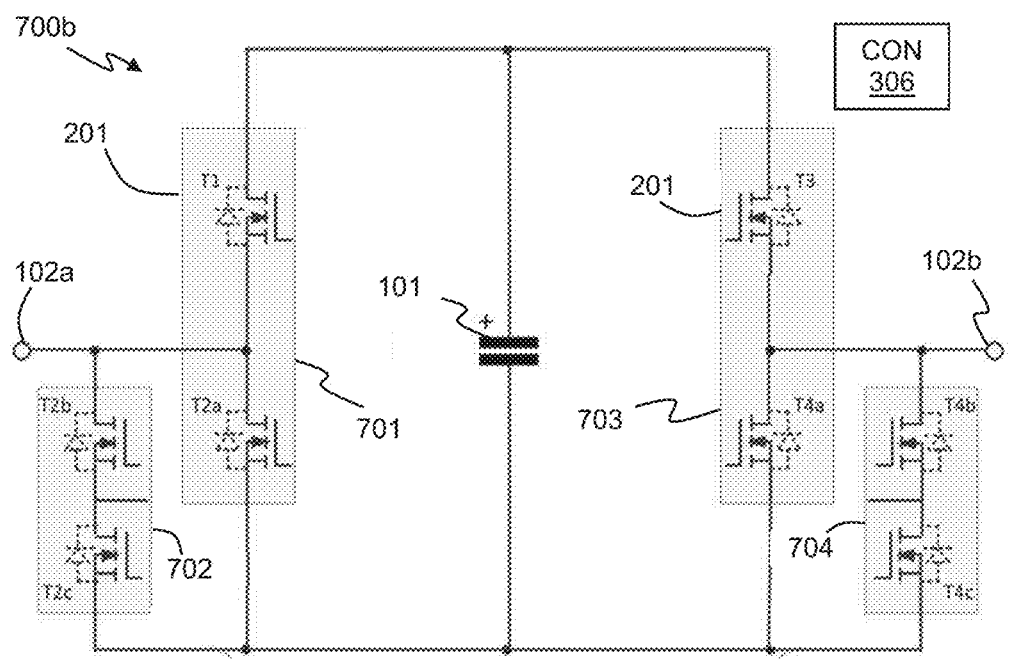

FIGS. 7a and 7b illustrate further designs of a half-bridge cell 700a and a full-bridge cell 700b suitable for a chain-link circuit of a VSC according to further embodiments. In FIGS. 7a and 7b similar components to those shown in the previous Figures are identified using similar reference numerals.

Cell 700a comprises a single capacitor 101 and a plurality of dual-switch semiconductor packages 201. A first dual-switch semiconductor package 701 is connected across the capacitor 101, with its intermediate terminal connected to the first cell terminal 102a. Switch T1 of dual-switch semiconductor package 701 is thus turned-on in the active state and turned-off in the bypass state, with switch T2a being turned-off in the active state and turned-on in the bypass state. To provide the additional parallel switches for current in the bypass state a second dual-switch semiconductor package 702 is connected between the cell terminals 102a and 102b. This means that switch T2a of the first dual-switch semiconductor package 701 is connected in parallel with the series connection of switches T2b and T2c of the second dual-switch semiconductor package 702.

In this arrangement the first dual-switch semiconductor package 701 may have a different voltage rating to the second dual-switch semiconductor package 702. Each of the switches T1 and T2a of the first dual-switch semiconductor package 701 should be rated for the DC voltage of the cell. It will be understood that in the bypass state the DC voltage of capacitor 101 will be experienced across switch T1 and in the active state the DC voltage will be experienced across switch T2a. For the second dual-switch semiconductor package 702 however the DC voltage will, in the active state, be applied across both switches T2b and T2c in series, thus the voltage rating of each switch of the second dual-switch semiconductor package 702 may be lower, e.g. up to half, of that of the switches of first dual-switch semiconductor package 701. Using semiconductor packages of different voltage ratings can be advantageous, as a wider array of dual-switch semiconductor packages can be used in these cells to provide the improved current handling in the bypass state.

Cell 700b of FIG. 7b shows a full bridge variant in which the second cell terminal 102b connects to the intermediate terminal of a third dual-switch semiconductor package 703 and a fourth dual-switch semiconductor package 704 is connected between the second cell terminal 102b and (in this example) the rail connected to the lower plate of capacitor 101 so as to provide a parallel switch path for the preferred bypass state. The fourth dual-switch semiconductor package 704 could have a different lower voltage rating that the third dual-switch semiconductor package 703.

Cells 700a and 700b also use a reduced number of components compared to some of the other variants which can provide for a cheaper and smaller cell and a simpler manufacturing process.

To avoid any voltage balancing issues associated with the series connected switches T2b and T2c turning-on or -off, the control of cells 700a and 700b could be arranged such that switch T2a is deliberately turned-on slightly before switches T2b and T2c are turned-on in a transition between states. Likewise switches T2b and T2c can be turned-off slightly before switch T2a is turned-off when transitioning from the bypass state to the active state. This means that switch T2a of the first dual-switch semiconductor package 701 will be substantially turned-on, reducing the voltage across the second dual-switch semiconductor package 702, at the time that the switches T2b and T2c are turned-on or off. This reduces the voltage stress across the switches and means voltage balancing issues are much less of a concern. Thus the intermediate terminal of the second dual-switch semiconductor package 702 can be left floating. Likewise, if T4b and T4c need switching they could be turned-on after switch T4a and turned-off before switch T4a.

All of the embodiments of the disclosure discussed above thus ensure that each semiconductor switch located at a switch positon of the cell which is used to conduct current during the (preferred) bypass state is connected in parallel with at least one other semiconductor switches. In all the embodiments discussed above at least one dual-switch semiconductor package is thus arranged as an additional switching package to provide parallel switches for the bypass state.

For example referring back to FIG. 3, dual-switch semiconductor packages 301 and 302a could be seen as providing principal current paths and dual-switch semiconductor package 302b can be seen as an additional switch package providing additional switches in parallel to those of dual-switch semiconductor package 302a. Likewise dual-switch semiconductor packages 303 and 304a could be seen as providing principal switching paths with the switches T7b and 8b of dual-switch semiconductor package 304b being additional switches. In each of FIGS. 4a, 4b, 5a and 5b dual-switch semiconductor packages 401 and 402a can be seen as providing principal current paths, with additional dual-switch semiconductor package 402b providing additional switches in parallel to those of dual-switch semiconductor package 402a. In FIGS. 6a and 6b dual-switch semiconductor packages 601 and 603 can be identified as providing principal current paths with additional dual-switch semiconductor package 603 providing additional switches in parallel to the respective switches of dual-switch semiconductor packages 601 and 602. In FIGS. 7a and 7b dual-switch semiconductor package 701 provides the principal switches with dual-switch semiconductor package 702 providing additional switches in parallel to principal switch T2a. As such additional dual-switch semiconductor packages provide the parallel switches that are used in the bypass state, this means that the cell topologies are readily scalable to provide any desired number of switches in parallel for the bypass state by just connecting more of the additional dual-switch semiconductor packages in parallel.

A further advantage of cells according to embodiments of the disclosure is that such additional parallel semiconductor switches can be physically separate from the principal semiconductor switches. As mentioned, positioning the additional switches at a location physically separate from the principal switches allows the number of additional parallel connected dual-switch semiconductor packages to be easily configured for a particular VSC application. The current rating of the combined additional semiconductor switches can thus be easily increased or decreased as required for a particular application.

Figure 8:
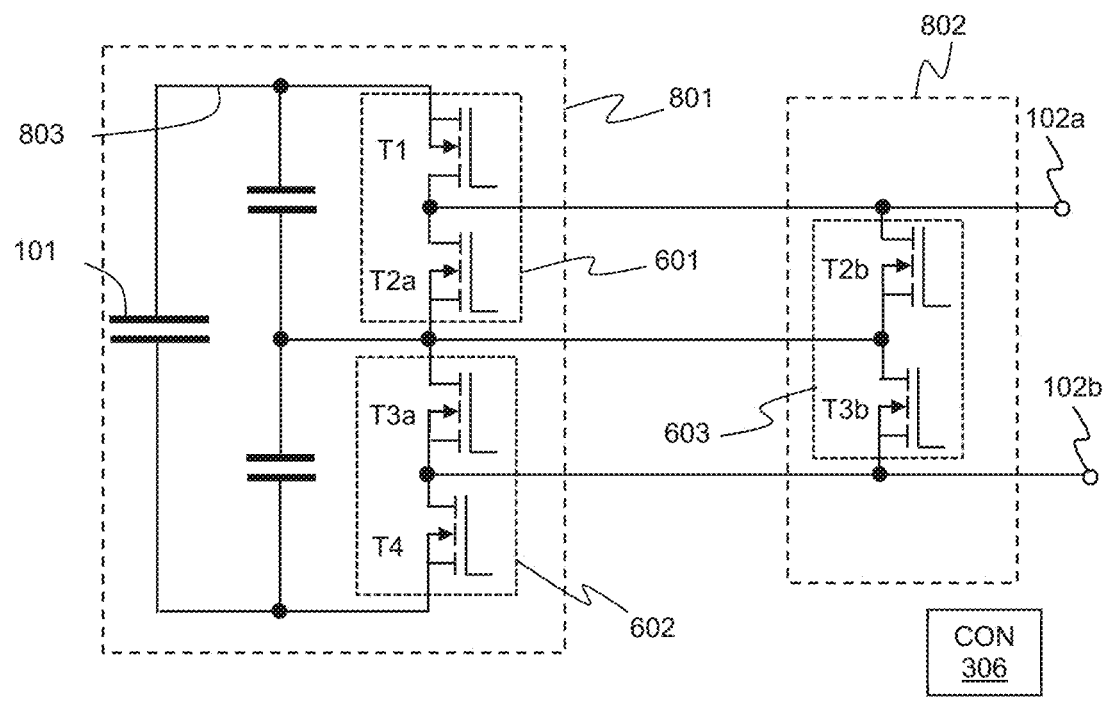
FIG. 8 illustrates how additional switches may be provided physically remote from a set of principal switches.

FIG. 8 illustrates this principle. FIG. 8 illustrates a cell topology similar to that illustrated in FIG. 6a. Dual-switch semiconductor packages 601 and 602 are arranged to provide principal semiconductor switches T1, T2a, T3a and T4 for providing the bypass and active states. Dual-switch semiconductor packages 601 and 602 are located on a first, main cooling plate 801. At least one additional dual-switch semiconductor package 603 is located on a physically separate cooling plate 802 to provide additional semiconductor switches T2b and T3b. Providing the separate cooling plate 802 can allow for the same basic cell design to allow for a variable number of additional dual-switch semiconductor packages to be readily accommodated as required for a particular application.

One possible disadvantage of this construction is that having the additional semiconductor switches, T2b and T3b, physically separated in this way may result in an increased inductance from the additional semiconductor switches to the capacitor.

In some embodiments the principal switches may be located relatively close to the main DC capacitor 101 and may be coupled to the main DC capacitor 101 by a relatively short and low inductance coupling, such as a busbar 803 with an inductance of less than 50 nH for example. If the additional switches are located relatively remotely on a separate cooling plate, there may be a greater stray inductance to these additional switches from the longer connection required.

The effect of an increase stray inductance can lead to increased switching stresses in the additional semiconductor switches when turning-on or off, which is undesirable. The change in current associated with turning the switch-on or off can interact with the inductance to give a voltage kick that could lead to an increased voltage stress on the switch.

Generally any additional switch(es) in parallel with a given one of the principal switches could be turned-on or off substantially simultaneously with the principal switch. However, in order to mitigate the effects of the increased stray inductance to the additional switches, in some embodiments that switch controller 306 may be configured to stagger the timing of the turn-on and/or turn-off of a principal switch and its associated additional parallel switches. For example in some embodiments the additional switch(es) could be turned-on slightly after the associated parallel principal switch is turned-on, so as to reduce the voltage stresses on the additional switches. Additionally or alternatively the additional switch(es) could be turned-off slightly before the associated parallel principal switch is turned-off.

Figure 9A:
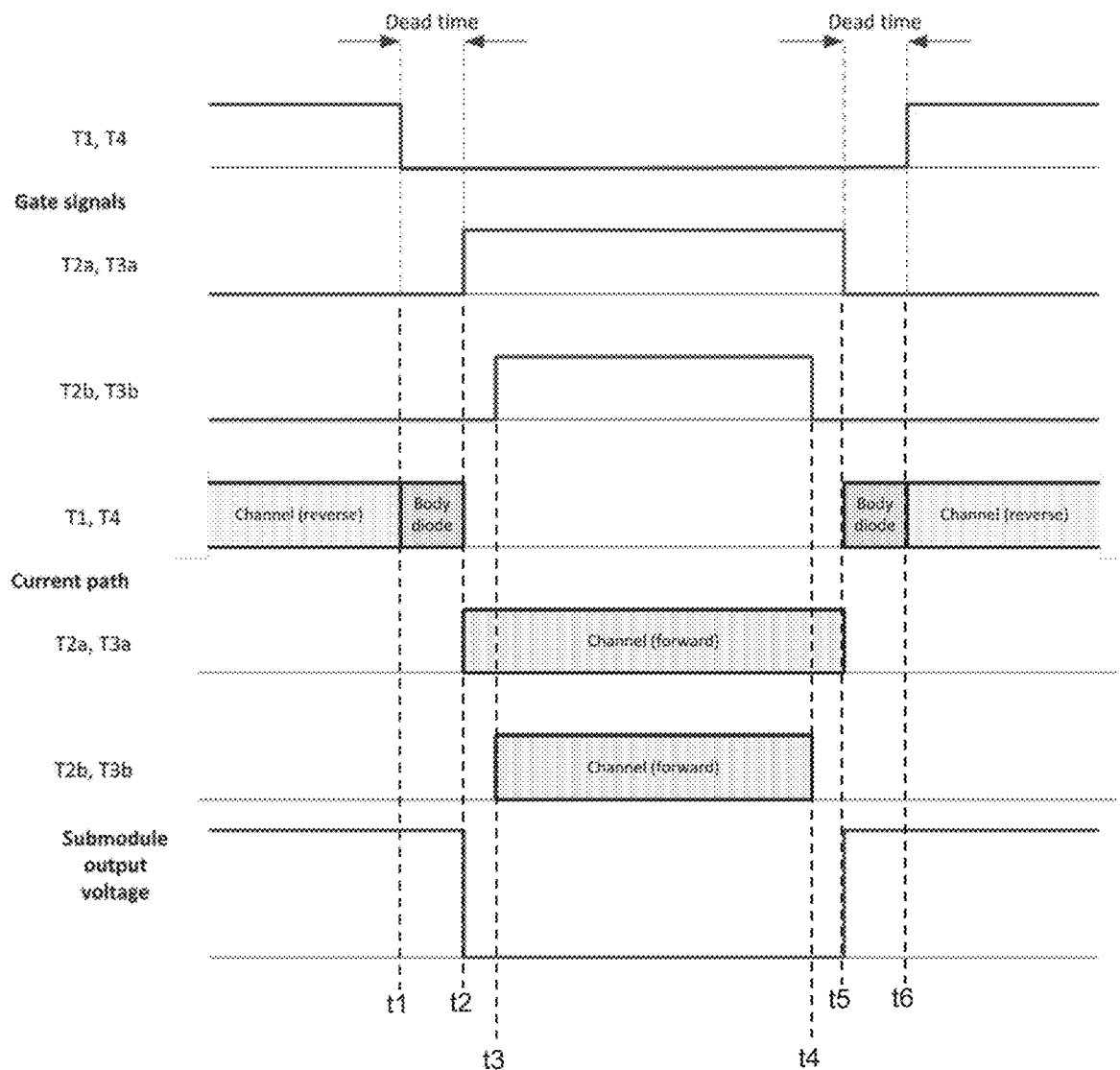
FIGS. 9a and 9b illustrates example timing diagrams for methods of switching of a cells according to embodiments.

FIG. 9a illustrates one example of switch timing control suitable for the example cell or submodule illustrated in FIG. 8.

As discussed previously to provide the active state, with a positive submodule output voltage, switches T1 and T4 are turned-on and the remaining switches off. FIG. 9a illustrates an example that starts in this active state and thus the gate signals to switches T1 and T4 are high to maintain these switches turned-on. The gate signals to the principal bypass switches T2a and T3a and also the gate signals to the additional bypass switches T2a and T3a are all low so that all these switches are off.

To transition to the bypass state switches T1 and T4 are turned off and the bypass switches are turned on. However, as will be understood by one skilled in the art the switches providing the active state are actually turned off slightly before the switches providing the bypass states are turned-on. This so called dead-time between turning one set of switches-off and turning the other set of switches on is to prevent both sets of switches being at least partially on at the same time, thus effectively connecting the upper and lower plates of the capacitor which could lead to an unwanted current shoot-through situation. During this dead-time period when both sets of switches are off current can still flow in the cell via the diodes associated with the semiconductor switches.

As mentioned previously when the semiconductor switches are implemented as IGBTs there may be a dedicated freewheel diode connected across the IGBT to allow for reverse conduction. However, in at least some application it may be desirable to use MOSFETs in the place of conventional IGBTs for HVDC applications, for example silicon-carbide MOSFETs. A feature of silicon-carbide MOSFETs is that it is not always necessary to provide a freewheel diode in the switching element. As one skilled in the art would understand a MOSFET has an inherent body diode, which can perform a similar function to a freewheel diode across an IGBT. However, the performance of a MOSFET body diode is relatively poor as the body diode has a relatively high forward bias voltage drop, e.g. around 3V for silicon-carbide due to the large band-gap of silicon carbide. Therefore, common practice has developed to use the conducting channel of the MOSFET when gated-on, as the main conduction path in both forward and reverse directions. The body-diode is then used only transiently during the 'dead time' where no voltage bias is applied to switches in the commutation from one conducting switch to another. The example cell illustrated in FIG. 8 may thus be implemented by MOSFETs with inherent body diodes.

Referring back to FIG. 9a, it can therefore be seen that at a time t1, the gate signals from semiconductor switches T1 and T4 goes low so as to turn these switches off. However no bypass switches are gated-on until a time t2 to allow a short dead time. In this example however only the principal switches T2a and T3a are gated-on at time t2. The additional switches T3b and T4b are only gated-on a short time later at time t3.

The staggered switching illustrated in FIG. 9a can reduces the switching stresses that can be caused if the additional semiconductor switches have an increased physical separation and hence increased stray inductance. As the cell transitions from the active state to the bypass state, the principal switches T2a and T3a begin conducting current just before the additional switches T2b and T3b. The principal switches are located physically closer to the capacitor than the additional switches and thus do not experience the same stray inductance effects. As the principal switches used in the bypass state begin conducting current before the additional switches, this can reduce the switching stresses experienced by the additional switches (compared to the case if all bypass switches were operated at the same time). Similarly, as the cell transitions from the bypass state to the active state the additional switches used in the bypass state are gated-off at a time t4 before the principal switches are gated-off at a time t5 and the switches for the active state are later gated-on at a time t6.

It will be noted that the switching example illustrated with respect to FIG. 9a transitions directly (with the necessary dead-time which is part of the transition) from the active state to the bypass state and vice-versa and thus does not make use of the intermediate active state that could be possible. It will be understood however that the same principles could apply if including an intermediate state with T1 and T3a/T3b gated on and the other switches off and/or an intermediate state with T2a/T2b and T4 gated on and the other switches off. In some instances the intermediate state could be implemented using the principal switches only, with the additional switches only being used in the bypass state, or the relevant principal and additional switches could be switched in sequence to provide the intermediate transition state.

Figure 9B:
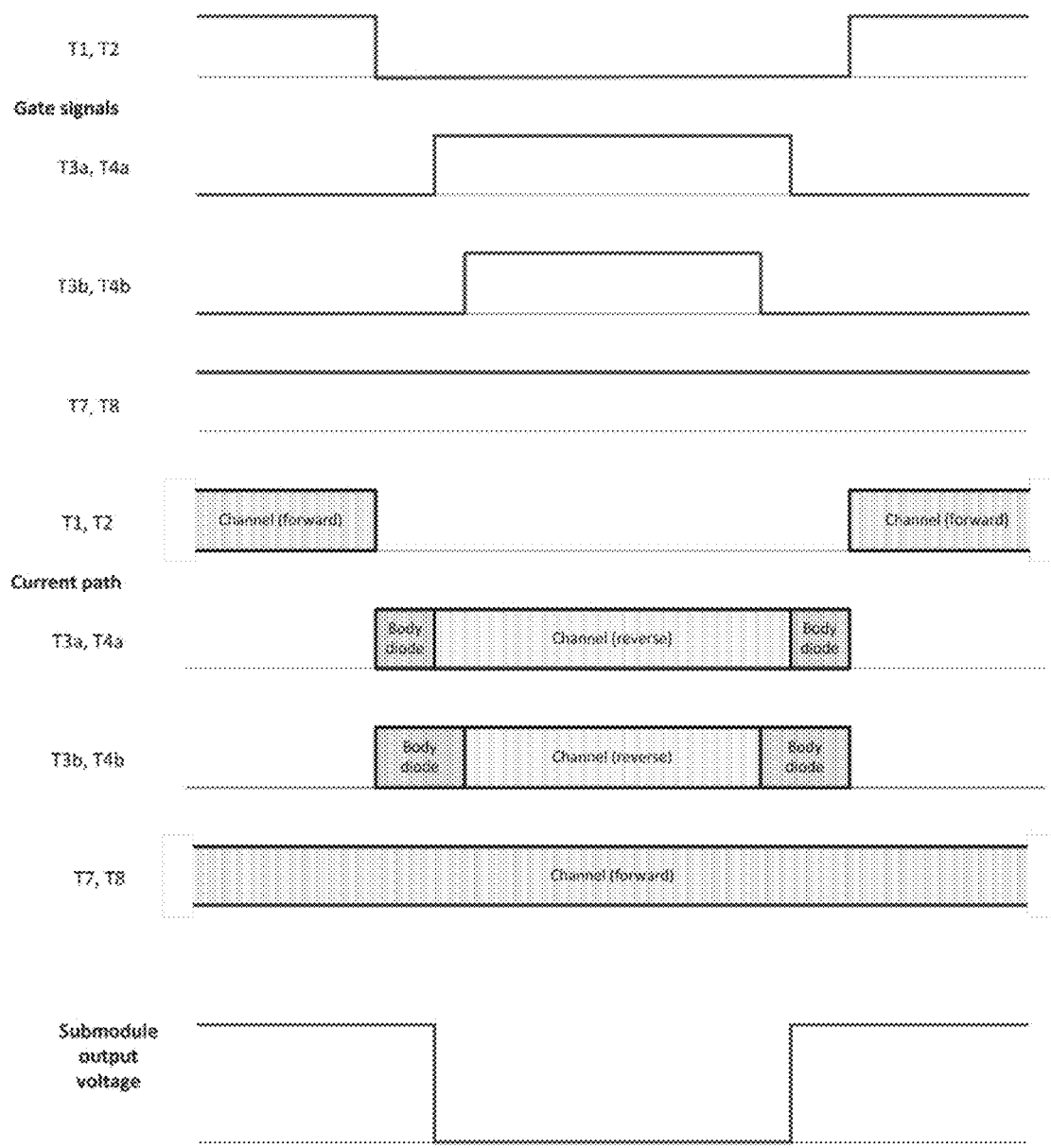

Clearly the same principles can be applied to other cells. FIG. 9b illustrates an example of how similar timing control may be employed for a full bridge cell, for example any of the full bridge cells illustrated in FIG. 3, 4b or 5b. In these examples cells the positive active state is provided by switches T1 and T2 being gated-on together with switches T7a/T7b and T8a/T8b. The preferred bypass state is provided by switches T3a/T3b and T4a/T4b being gated-on together with switches T7a/T7b and T8a/T8b.

In the example switch control illustrated in FIG. 9b the cell is controlled to alternate, in normal operation, between just these two states, i.e. the positive active state and the preferred bypass state. The gate control signal for switches T7a/T7b and T8a/T8b (referred to generally as T7, T8) is thus continuously high and the gate control signal for switches T5 and T6 (not illustrated) is continuously low. The switches T1 and T2 that are only gated-on for the active state and the switches T3a/T3b and T4a/T4b which are gated-on only for the bypass state may be sequenced in the same way as described with reference to FIG. 9a for similar advantages with respect to voltage stresses.

In the example above the additional switches that conduct current only during the bypass state may be turned-on after the associated parallel principal switch and may be turned-off before the associated parallel principal switch. In some embodiments other sequencing may be used. For instance in some embodiment the voltage transients associated with a switch transition may be worse for switch turn-off than turn-on. Thus the additional switches may be turned-off before the associated parallel principal switch so as to avoid undue voltage stresses. However for switch turn-on the additional switches could be turned-on at substantially the same as the associated parallel principal switch. In some instance the additional switches may be turned-on before the associated parallel principal switch. This would mean that the additional semiconductor switches, which may be further away from the DC capacitor and thus experience greater inductance, would be switched-on at non-zero voltage but switched off at zero voltage. Since transient overvoltage during switching is generally a bigger issue at turn-off than at turn-on, this mitigates voltage stress at turn-off and has the advantage, for MOSFET implementations, that the greater inductance between the additional switches and the capacitor will reduce the rate of change of current in the principal MOSFET and thus the reverse recovery current of their body diodes.

All embodiments of the invention could be implemented using any kind of dual-switch semiconductor package. However, the use of dual-switch semiconductor packages comprising silicon-carbide MOSFETs provides advantages as discussed above and represents one particular aspect of this disclosure. The HVDC industry is moving towards the use of dual-switch semiconductor packages because these packages can easily be connected in parallel to provide higher current ratings. Connecting silicon-carbide MOSFETs in parallel using the packages provides a greater improvement on current rating and losses than using conventional IGBTs in the same way.

Figure 10:
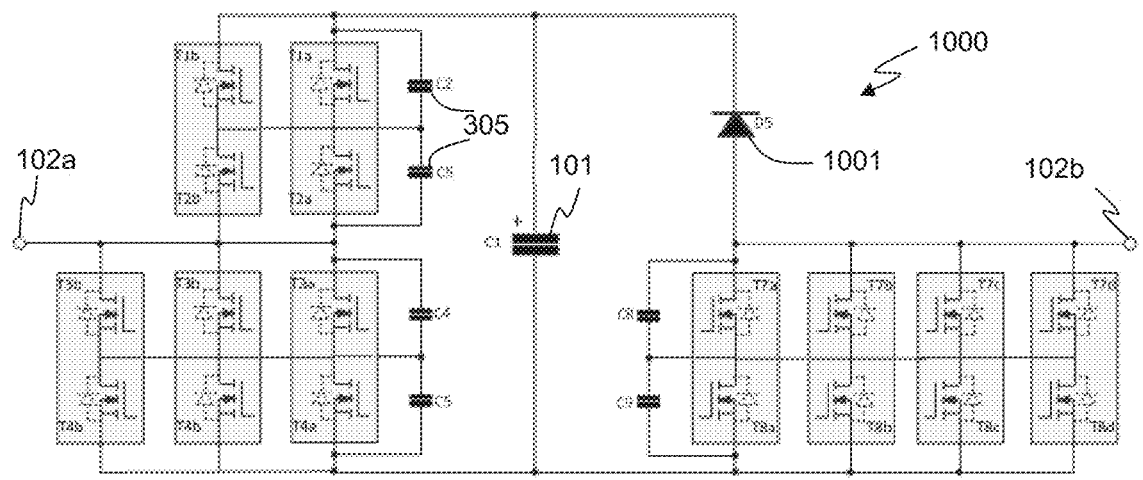
FIG. 10 illustrates a further example of a full-bridge type cell with a diode in one switch position.

As discussed above in relation to FIG. 9b, in some instances a full-bridge cell topology may be implemented, but in normal operation the negative active state may not be used. Thus, as discussed previously, for example with respect to FIG. 3, the switches at some switch positions may not be used or may be continually on in normal operation. For instance referring back to FIG. 3, switches T5 and T6 at the third switch position may be continually off in normal operation and the switches at the fourth switch position may be continually on. In some embodiments therefore the switches at a switch position which are normally off in normal operation could be replaced with one or mode diodes. FIG. 10 shows an embodiment which is a variant of the cell illustrated in FIG. 3 in which the switches (T5 and T6) at the third switch positon are replaced by a low-cost diode 1001. The diode 1001 would, in normal operation be reverse biased and thus block conduction. The diode would however act as a snubber to alleviate the turn-off stresses at the fourth position T7/T8 when those transistors are turned off to suppress a DC-side fault current.

FIG. 10 also illustrates that a set of switches which only conducts current in the active state could also be implemented by a desired number of parallel switches and in this example the first switch position comprises switches T1a and T1b in parallel and switches T2a and T2b in parallel. However there are more switches in parallel in the switch positions that conduct current in the (preferred) bypass state.

FIG. 10 also illustrates that there may be different numbers of parallel switches in different switch positions, even for switch positions that are used in the (preferred) bypass state. In the example shown in FIG. 10 as the switches in the fourth switch position are continuously on in normal operation there may be a greater number of parallel connected dual-switch semiconductor packages at this position, four in this example, than at the second switch position.

Figure 11:
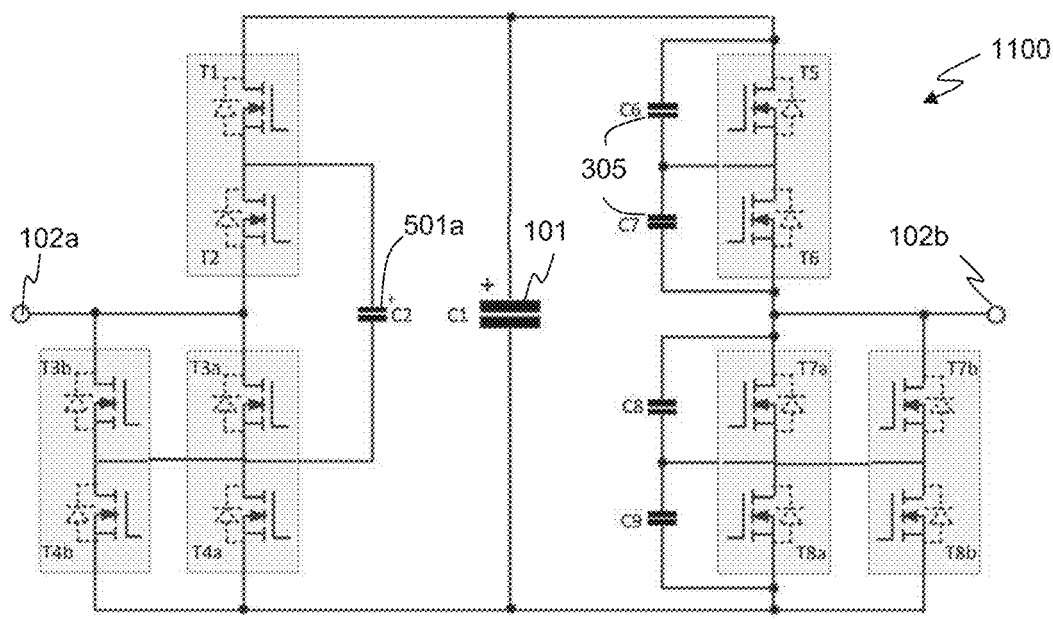
FIG. 11 illustrates a further example of a full-bridge type cell with mixed topologies.

Various different topologies and operating regimes have been described above and one skilled in the art will understand that various features described with respect to one embodiment may generally be utilised in any other compatible embodiments. Indeed in some embodiments it may be advantages to use different topologies together. As an example FIG. 11 illustrates an example of a full bridge cell 1100 in which the first cell terminals 102 is connected to set of switches implemented according to a three-level flying capacitor type topology such as discussed with respect to FIG. 5a. This can provide the advantage of an intermediate positive active state. The second cell terminal is connected to dual-switch semiconductor packages having individual voltage balancing capacitors 305 such as discussed in relation to FIG. 3 which may allow for easier manufacture and connection. Thus aspects of the various embodiments can be combined for the various advantages described above.

In another embodiment an additional dual-switch semiconductor package may be positioned in series with the main DC capacitor(s). This arrangement could be applied to any of the full-bridge cells described previously. In this embodiment, when operating in the bypass state, the package in series with the capacitor could be operated to be turned off, thus completely isolating the capacitor(s) from the rest of the cell. In this arrangement, both the top and bottom rails of the cell could conduct current simultaneously in parallel. This would therefore share the current across an even greater number of semiconductor elements in the bypass state and thus provide further stress saving measures.

In general though all embodiments allow a greater number of semiconductor switches to be arranged in parallel in a switch position that requires conduction during the (preferred) bypass state than are provided in a switch position that is not used for conduction during the (preferred) bypass state.

It should be noted that cells used for chain-link circuits of a VSC may be provided with a fault bypass switch which is separate to the semiconductor switches of the cell used in normal operation. Such a fault bypass switch, which may comprise a mechanical switch element, is used to short circuit the cell terminals in a relatively permanent manner in the event of a fault with the submodule. Some variants of a fault bypass switch may include some semiconductor switching element. However the fault bypass switch is not used during normal, non-faulted operation of the cell and thus does not, in normal operation, conduct current during the normal bypass state of the cell and instead in only used in a separate fault state.

Figure 12:
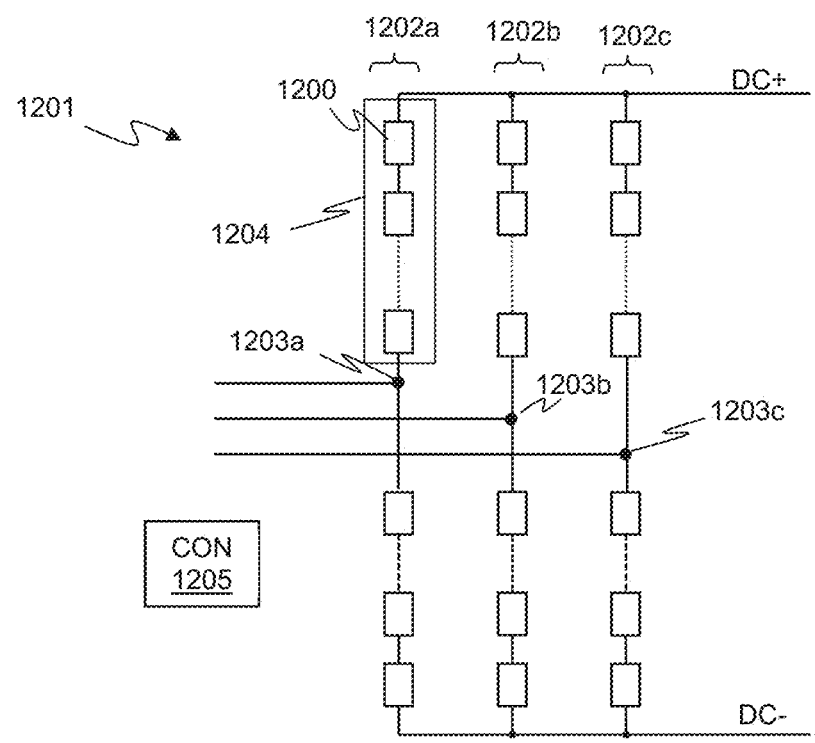
FIG. 12 illustrates a VSC according to embodiments.

As mentioned above any of cells discussed herein may be used as part of a VSC. FIG. 12 illustrates one example of a VSC 1201 that may utilise cells 1200 according to embodiments of the disclosure. The VSC 1201 illustrated in FIG. 12 has three phase limbs 1202a-c. Each phase limb has a high side phase arm connecting a respective AC terminal 1203a-c to the positive DC terminal DC+ and a low side phase arm connecting the respective AC terminal 1203a-c to the negative DC terminal DC−.

Note that as used herein the terms positive and negative are used in a relative sense, i.e. the positive terminal is more positive/less negative than the negative terminal and vice versa. In some embodiments one of the positive or negative DC terminals could be held at ground. In this example each phase arm comprises a chain-link circuit 1204 which comprises a plurality of series connected cells 1200 wherein at least some of the cells 1200 may be cell according to any of the embodiments discussed above. A controller 1205 may control switching of the cells of the chain-link circuits 1204 by providing switching orders to the cells 1200 of the chain-link circuit to provide desired voltage wave-shaping across the whole chain-link circuit 1204.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality. Any reference signs in the claims shall not be construed so as to limit their scope.

The invention claimed is:

1. A cell for a voltage source converter, comprising:
first and second cell terminals;

a first energy storage apparatus; and a plurality of dual-switch semiconductor packages, each dual-switch semiconductor package comprising first and second semiconductor switches electrically connected in series between a first package terminal and a second package terminal and a third package terminal electrically connected to a node between the first and second semiconductor switches;

wherein, the plurality of dual-switch semiconductor switch packages are configured so as to be operable in a first active state in which the first energy storage apparatus is electrically connected in series between the first and second cell terminals and a bypass state in the first and second cell terminals are electrically connected via a path that bypasses the first energy storage apparatus;

wherein, the plurality of dual-switch semiconductor switch packages are configured such that:

a first set of semiconductor switches is connected between nodes of the cell that are electrically connected in the first active state and electrically disconnected in the first bypass state; and a second set of semiconductor switches is connected between nodes of the cell that are electrically disconnected in the first active state and electrically connected in the bypass state; and the second set of switches comprises a greater number of switches in parallel than the first set of switches.

2. The cell in claim 1 wherein, the plurality of dual-switch semiconductor switch packages are configured such that a third set of semiconductor switches is connected between nodes of the cell that are electrically connected in both the first active state and also in the bypass state wherein each of the second set of switches and third set of switches comprises a greater number of switches in parallel than the first set of switches.

3. The cell in claim 2 wherein the plurality of dual-switch semiconductor switch packages are configured so as to be further operable in a second active switching state in which the first energy storage apparatus is electrically connected in series between the first and second cell terminals in an opposite orientation to the first switching state;

wherein, the plurality of dual-switch semiconductor switch packages are configured such that a fourth set of semiconductor switches is connected between nodes of the cell that are electrically disconnected in both the first active state and the first bypass state and electrically connected in the second active state;

wherein each of the second set of switches and third set of switches comprises a greater number of switches in parallel than either of the first set of switches and the fourth set of switches.

4. The cell in claim 1 wherein at least one dual-switch semiconductor package is connected between the first cell terminal and one terminal of the energy storage apparatus to provide said first set of switches and at least two dual-switch semiconductor packages are connected between the first cell terminal and an opposite terminal of the energy storage apparatus to provide said second set of switches.

5. The cell in claim 4 wherein the intermediate package terminal of said at least one dual-switch semiconductor package providing said first set of switches is connected to the intermediate package terminals of said at least two dual-switch semiconductor packages providing said second set of switches via a flying capacitor.

6. The cell in claim 4 wherein the first energy storage apparatus comprises a first capacitor in series with a second capacitor and wherein the intermediate package terminal of said at least one dual-switch semiconductor package providing said first set of switches is connected to a midpoint node between the first capacitor and second capacitor by a first steering diode and the intermediate package terminals of said at least one dual-switch semiconductor package providing said second set of switches is connected to the midpoint node between the first capacitor and second capacitor by a second steering diode.

7. The cell in claim 1 wherein the plurality of dual-switch semiconductor packages comprises first dual-switch semiconductor package configured such that the first semiconductor switch of the first dual-switch semiconductor package forms at least part of said first set of switches and the second semiconductor switch of the first dual-switch semiconductor package forms part of said second set of switches.

8. The cell in claim 7 wherein the plurality of dual-switch semiconductor packages further comprises a second dual-switch semiconductor package configured such that the first semiconductor switch of the second dual-switch semiconductor package forms part of said second set of switches and the second semiconductor switch of the second dual-switch semiconductor package forms part of the first set of switches and a third dual-switch semiconductor package connected in parallel with second and first switches respectively of the first and second dual-switch semiconductor packages.

9. The cell in claim 7 wherein the plurality of dual-switch semiconductor packages further comprises a second dual-switch semiconductor package connected in parallel with the second switch of the first dual-switch semiconductor package.

10. The cell in claim 9 wherein the second dual-switch semiconductor package has a lower voltage rating than the first dual-switch semiconductor package.

11. The cell in claim 1 wherein at least one dual-switch semiconductor package is connected directly between the first and second cell terminals to provide some of the second set of switches.

12. The cell in claim 1 wherein the second set of switches comprises at least one principal switch and at least one additional dual-switch package wherein the at least one additional dual-switch package is more remote from the energy storage apparatus than the at least one principal switch.

13. The cell in claim 12 wherein the cell comprises a switch controller configured to, during a switch transition that involves turning-off the switches of the second set, to turn the switches of the at least one additional dual-switch package off before the at least one principal switch.

14. The cell in claim 12 wherein the cell comprises a switch controller configured to, during a switch transition that involves turning-on the switches of the second set, to turn the switches of the at least one additional dual-switch package on after the at least one principal switch.

15. The cell in claim 12 wherein the cell comprises a switch controller configured to, during a switch transition that involves turning-on the switches of the second set, to turn the switches of the at least one additional dual-switch package on before the at least one principal switch.

* * * * *